(12) United States Patent
Matsumoto

(10) Patent No.: US 9,082,581 B2
(45) Date of Patent: Jul. 14, 2015

(54) BLANKING DEVICE FOR MULTIPLE CHARGED PARTICLE BEAMS

(71) Applicant: NuFlare Technology, Inc., Yokohama (JP)

(72) Inventor: Hiroshi Matsumoto, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/508,191

(22) Filed: Oct. 7, 2014

(65) Prior Publication Data

US 2015/0102231 A1    Apr. 16, 2015

(30) Foreign Application Priority Data

Oct. 11, 2013    (JP) ................................. 2013-214123

(51) Int. Cl.
*H01J 37/147*    (2006.01)
*H01J 37/317*    (2006.01)
*H01J 37/30*    (2006.01)

(52) U.S. Cl.
CPC ........... *H01J 37/147* (2013.01); *H01J 37/3007* (2013.01); *H01J 37/3177* (2013.01)

(58) Field of Classification Search
USPC ........................................ 250/396 R, 492.22
See application file for complete search history.

(56) References Cited

U.S. PATENT DOCUMENTS

| | | | | |
|---|---|---|---|---|
| 5,528,048 | A | * | 6/1996 | Oae et al. ................. 250/492.22 |
| 5,841,145 | A | * | 11/1998 | Satoh et al. .............. 250/492.22 |
| 2005/0242302 | A1 | | 11/2005 | Platzgummer et al. |
| 2005/0242303 | A1 | | 11/2005 | Platzgummer |

FOREIGN PATENT DOCUMENTS

| | | |
|---|---|---|
| JP | 11-176719 | 7/1999 |
| JP | 4843248 | 10/2011 |

* cited by examiner

*Primary Examiner* — Kiet T Nguyen
(74) *Attorney, Agent, or Firm* — Oblon, McClelland, Maier & Neustadt, L.L.P.

(57) ABSTRACT

A blanking device for multiple charged particle beams includes plural shift registers, arranged in two dimensions, to form plural groups each including shift registers, connected in series, of the plural shift registers, plural blankers to respectively provide a blanking deflection to a corresponding beam of multiple beams each controlled through a corresponding shift register in the plural shift registers, plural serial parallel conversion units, arranged along the four sides of a quadrangular region which surrounds the whole of the plural shift registers, to be respectively connected by parallel wiring to at least one of the plural groups, and plural pads, arranged along the four sides of the quadrangular region, to be respectively in combination with a corresponding serial parallel conversion unit of the plural serial parallel conversion units such that each of the plural pads is connected by single wiring to the corresponding serial parallel conversion unit.

12 Claims, 16 Drawing Sheets

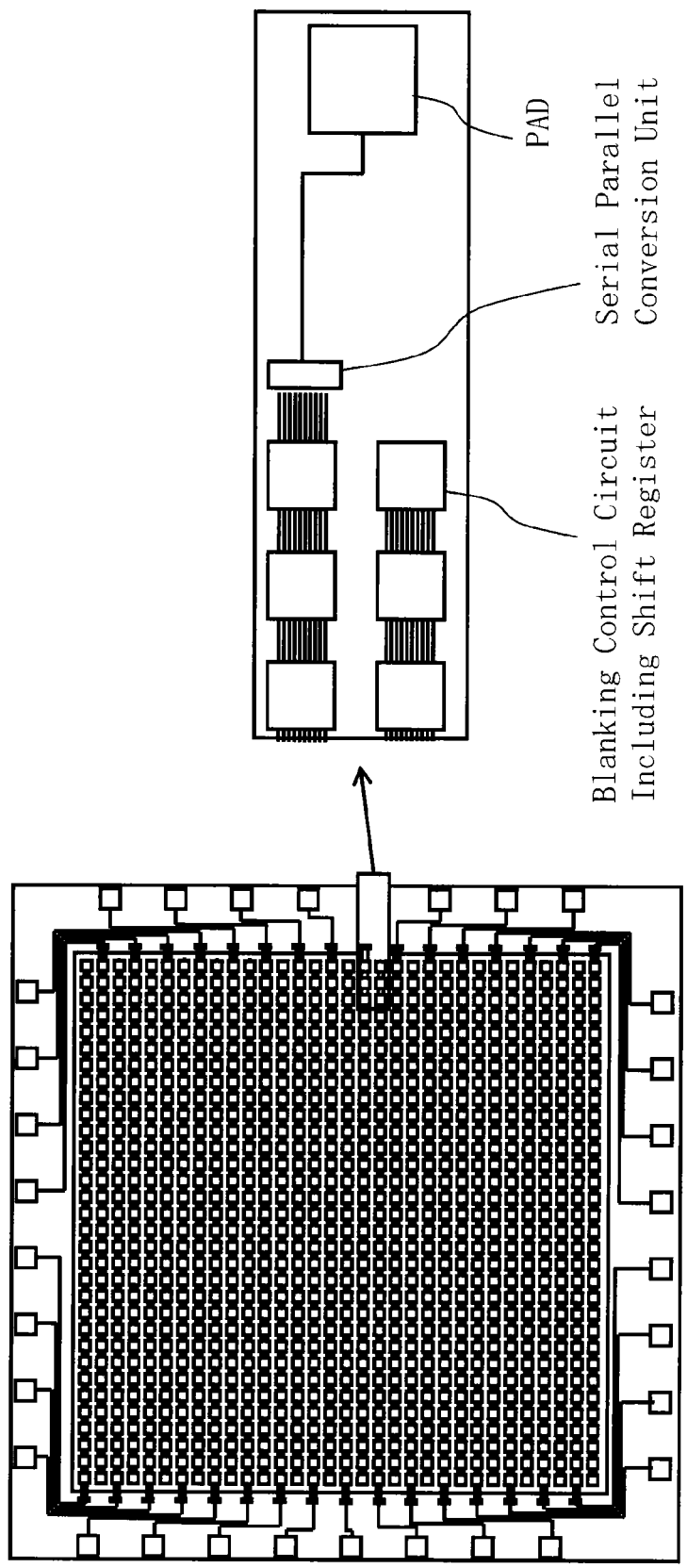

BLANKING DEVICE FOR MULTIPLE CHARGED PARTICLE BEAMS

CROSS-REFERENCE TO RELATED APPLICATION

This application is based upon and claims the benefit of priority from the prior Japanese Patent Application No. 2013-214123 filed on Oct. 11, 2013 in Japan, the entire contents of which are incorporated herein by reference.

BACKGROUND OF THE INVENTION

1. Field of the Invention

The present invention relates to a blanking device for blanking multiple charged particle beams, and more specifically, to a blanking device in multi beam writing, for example.

2. Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer and the like with electron beams.

As an example employing the electron beam writing technique, a writing apparatus using multiple beams (multi-beams) can be cited. Compared with the case of writing a pattern by using a single electron beam, since it is possible to emit multiple beams at a time in multiple writing, the throughput can be greatly increased. For example, in the writing apparatus employing a multi-beam system, multiple beams are formed by letting an electron beam emitted from an electron gun assembly pass through a mask with a plurality of holes, blanking control is performed for each of the beams, and each unblocked beam is reduced by an optical system and deflected by a deflector so as to irradiate a desired position on a target object or "sample".

In multi-beam writing, the dose of each beam is individually controlled based on an irradiation time. For highly accurately controlling such a dose of each beam, it is necessary to perform blanking control to provide on or off of a beam at high speed. In a writing apparatus of a multi-beam system, a blanking control circuit for each beam is placed on a blanking plate where each blanker for use in multiple beams is arranged. It has been considered to respectively embed a shift register in the control circuit for each beam and to output a signal from a pad to shift registers connected in series in each row, in a plurality of blankers arranged in a matrix. In order to execute the contents of the consideration, pads whose number is the same as that of the rows of a plurality of blankers need to be located at the blanking plate. On the other hand, for suppressing a signal delay, it is desirable for the length of wiring from each pad to the shift register at the end of corresponding shift registers connected in series, to be equal to each other. Therefore, it has been examined to arrange each pad at a beam pitch at one of the four sides of a quadrangular region where a plurality of blankers are arranged in a matrix. In that case, since each blanker and each control circuit arranged at the blanking plate are manufactured using the LSI manufacturing technology, there is an upper limit for the chip size, which is about 20 mm. Therefore, if the number of beams increases and thus the number of rows increases, it becomes difficult to arrange pads, whose number is corresponding to the number of the rows, at one side of the blanking plate. For example, assuming that the beam arrangement is 512×512, the beam pitch is about 32 μm and thus the distance between pads becomes too narrow to arrange the pads.

Moreover, when the number of beams increases, the number of shift registers arranged in one row also increases. Therefore, data transmission will take time. The number of shift registers connected in series needs to be decreased in order to perform a high-speed operation, but, if the number of shift registers connected in series is reduced, the number of pads will increase. Thereby, it becomes further difficult to arrange the pads.

Furthermore, although differing from the case where data transmission is performed using a shift register, there has conventionally been considered a blanking plate in which electrode pads, whose number is the same as that of blankers, are arranged so as to surround the blankers (blanking electrodes) for use in multiple beams (e.g., refer to Japanese Published Unexamined Patent Application (JP-A) No. 11-176719). According to this technique, a deflection voltage is directly applied to the electrode of each blanker from the pad.

BRIEF SUMMARY OF THE INVENTION

According to one aspect of the present invention, a blanking device for multiple charged particle beams includes a substrate, in which a plurality of openings are formed, the plurality of openings being arranged in two dimensions and through which multiple beams pass; a plurality of shift registers, which are formed close to a corresponding opening in the plurality of openings on the substrate, configured to be arranged in two dimensions and to form a plurality of groups each including shift registers connected in series of the plurality of shift registers; a plurality of blankers, each of which includes a pair of electrodes arranged on the substrate to be at opposite sides of a corresponding opening in the plurality of openings, configured to respectively provide a blanking deflection to a corresponding beam of the multiple beams by generating a deflection electric field which is generated by respectively controlling at least one of the pair of electrodes through a shift register for a corresponding beam in the plurality of shift registers; a plurality of serial parallel conversion units configured to be arranged along four sides of a quadrangular region surrounding a whole of the plurality of shift registers and to be respectively connected by parallel wiring to at least one of the plurality of groups; and a plurality of pads configured to be arranged along the four sides of the quadrangular region, and to be respectively in combination with a corresponding serial parallel conversion unit of the plurality of serial parallel conversion units such that each of the plurality of pads is connected by single wiring to the corresponding serial parallel conversion unit.

According to another aspect of the present invention, a multi charged particle beam writing apparatus includes a stage configured to mount a target object thereon and to be continuously movable; an emission unit configured to emit a charged particle beam; an aperture member, in which a plurality of first openings are formed, configured to form multiple beams by letting a region including a whole of the plurality of first openings be irradiated with the charged particle beam and letting portions of the charged particle beam respectively pass through a corresponding opening of the plurality of first openings; a substrate, in which a plurality of second openings are formed, the plurality of openings being arranged in two dimensions and through which multiple beams pass; a plurality of shift registers, which are formed close to a corresponding opening in the plurality of openings on the substrate, configured to be arranged in two dimensions and to form a plurality of groups each including shift registers connected in series of the plurality of shift registers; a plurality of blankers, each of which includes a pair of electrodes arranged on the substrate to be at opposite sides of a corresponding opening in the plurality of second openings, configured to respectively provide a blanking deflection to a corresponding beam of multiple beams having passed through the plurality of openings of the aperture member, by generating a deflection electric field which is generated by respectively controlling at least one of the pair of electrodes through a shift register for a corresponding beam in the plurality of shift registers; a plurality of serial parallel conversion units configured to be arranged along four sides of a quadrangular region surrounding a whole of the plurality of shift registers and to be respectively connected by parallel wiring to at least one of the plurality of groups; and a plurality of pads configured to be arranged along the four sides of the quadrangular region, and to be respectively in combination with a corresponding serial parallel conversion unit of the plurality of serial parallel conversion units such that each of the plurality of pads is connected by single wiring to the corresponding serial parallel conversion unit.

BRIEF DESCRIPTION OF THE DRAWINGS

FIGS. 8A and 8B are top views showing the configuration of a blanking plate used as a comparative example C of the first embodiment;

DETAILED DESCRIPTION OF THE INVENTION

In the following embodiments, there will be described a configuration in which an electron beam is used as an example of a charged particle beam. The charged particle beam is not limited to the electron beam, and other charged particle beam such as an ion beam may also be used.

In the following embodiments, there will be described a blanking device which performs blanking control of multiple beams by using a shift register and in which more pads can be arranged.

First Embodiment

Figure 1:
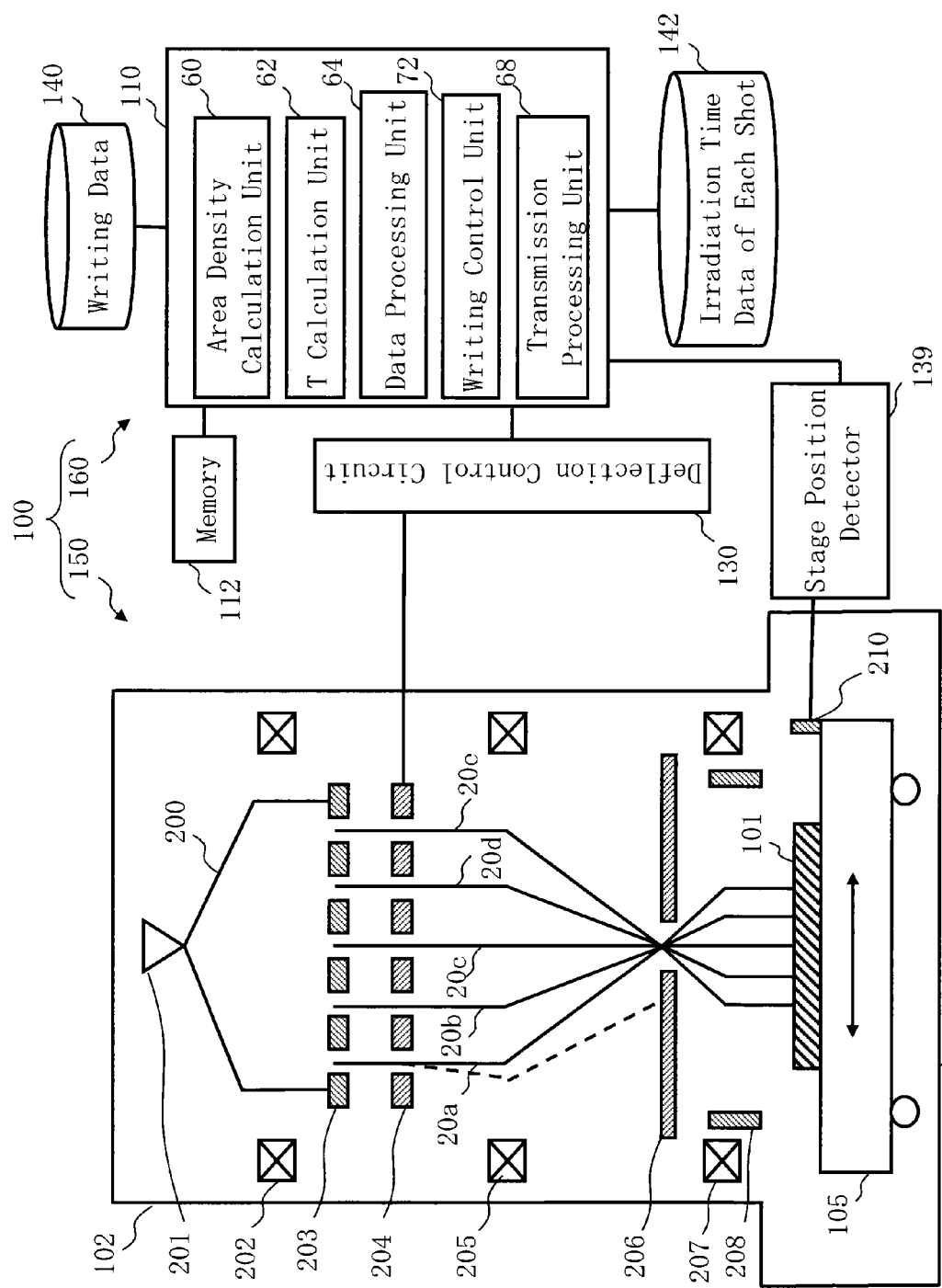
FIG. 1 is a schematic diagram showing the configuration of a writing apparatus according to a first embodiment.

FIG. 1 is a schematic diagram showing a configuration of a writing or "drawing" apparatus according to the first embodiment. In FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, an aperture member 203, a blanking plate 204, a reducing lens 205, a limiting aperture member 206, an objective lens 207, and a deflector 208. In the writing chamber 103, there is arranged an XY stage 105. On the XY stage 105, there is placed a target object or "sample" 101 such as a mask serving as a writing target substrate when performing writing. The target object 101 is, for example, an exposure mask used for manufacturing semiconductor devices, or is a semiconductor substrate (silicon wafer) on which semiconductor elements are formed. The target object 101 may be, for example, a mask blank on which resist is applied and a pattern has not yet been formed. On the XY stage 105, further, there is arranged a mirror 210 for measuring the position of the XY stage.

The control unit 160 includes a control computer 110, a memory 112, a deflection control circuit 130, a stage position detector 139, and storage devices 140, and 142, such as magnetic disk drives. The control computer 110, the memory 112, the deflection control circuit 130, the stage position detector 139, and the storage devices 140 and 142 are mutually connected through a bus (not shown). Writing data is input into the storage device 140 (storage unit) from the outside to be stored therein.

In the control computer 110, there are arranged an area density calculation unit 60, an irradiation time T calculation unit 62, a data processing unit 64, a writing control unit 72, and a transmission processing unit 68. Functions such as the area density calculation unit 60, the irradiation time T calculation unit 62, the data processing unit 64, the writing control unit 72, and the transmission processing unit 68 may be configured by hardware such as an electric circuit, or by software such as a program causing a computer to implement these functions. Alternatively, they may be configured by a combination of hardware and software. Data which is input and output to/from the area density calculation unit 60, the irradiation time T calculation unit 62, the data processing unit 64, the writing control unit 72, or the transmission processing unit 68 and data being calculated are stored in the memory 112 each time.

FIG. 1 shows a configuration necessary for explaining the first embodiment. Other configuration elements generally necessary for the writing apparatus 100 may also be included.

Figure 2A:
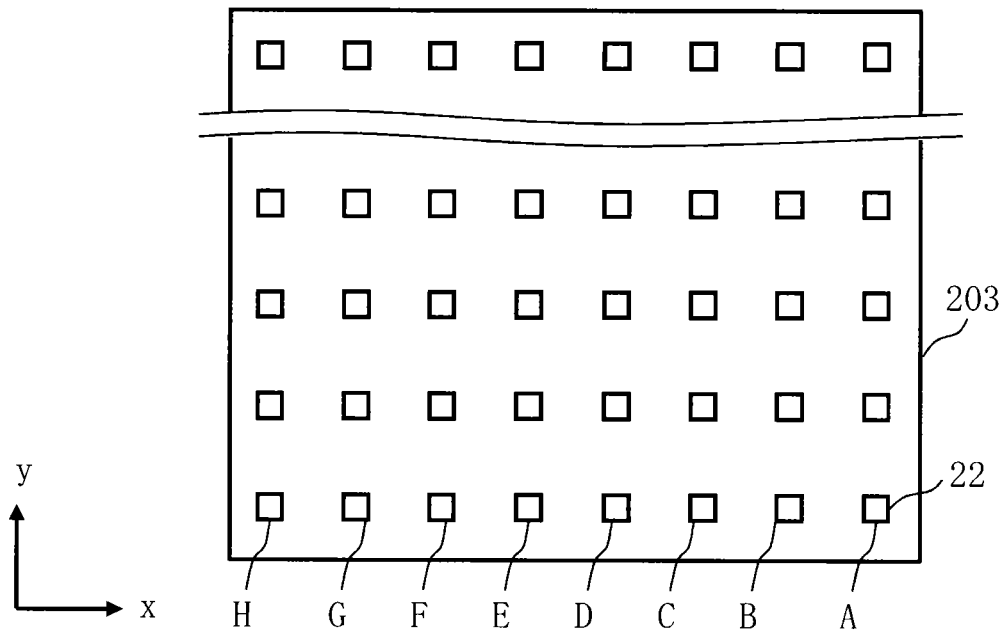
FIGS. 2A and 2B are conceptual diagrams each showing the configuration of an aperture member according to the first embodiment.
Figure 2B:
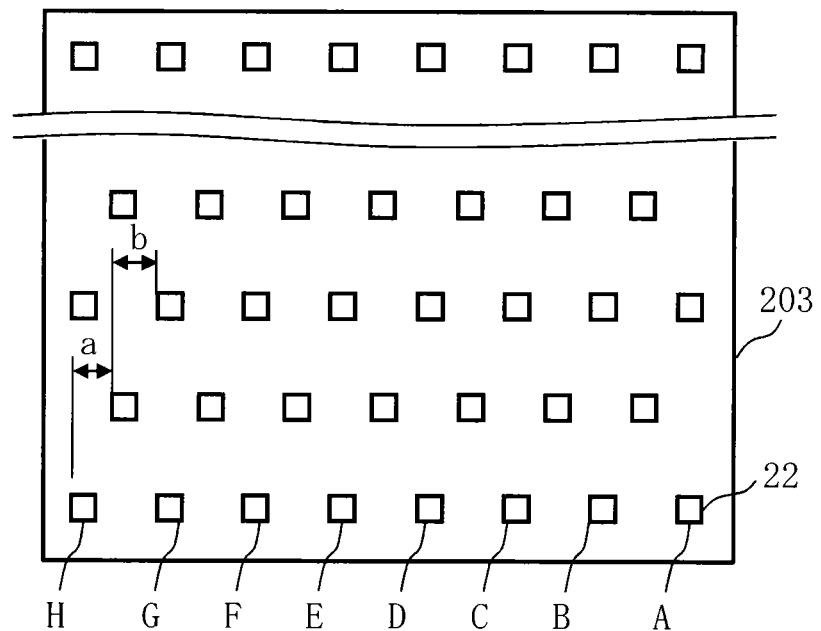

FIGS. 2A and 2B are conceptual diagrams each showing an example of the configuration of an aperture member according to the first embodiment. In FIG. 2A, holes (openings) 22 are formed at a predetermined arrangement pitch, in the shape of a matrix, in the aperture member 203, wherein m×n (m≥2, n≥2) holes 22 are arranged in m columns in the vertical direction (the y direction) and n rows in the horizontal direction (the x direction). In FIG. 2A, holes 22 of 512 (rows)×8 (columns) are formed, for example. Each hole 22 is a quadrangle of the same dimensions and shape. Alternatively, each hole may be a circle of the same circumference. In this case, there is shown an example of each row having eight holes 22 from A to H in the x direction. Multi-beams 20 are formed by letting portions of an electron beam 200 respectively pass through a corresponding hole of a plurality of holes 22. Here, there is shown the case where the holes 22 are arranged in a plurality of columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2A where holes are aligned in a grid. It is also preferable to arrange the holes 22 as shown in FIG. 2B where the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

Figure 3:
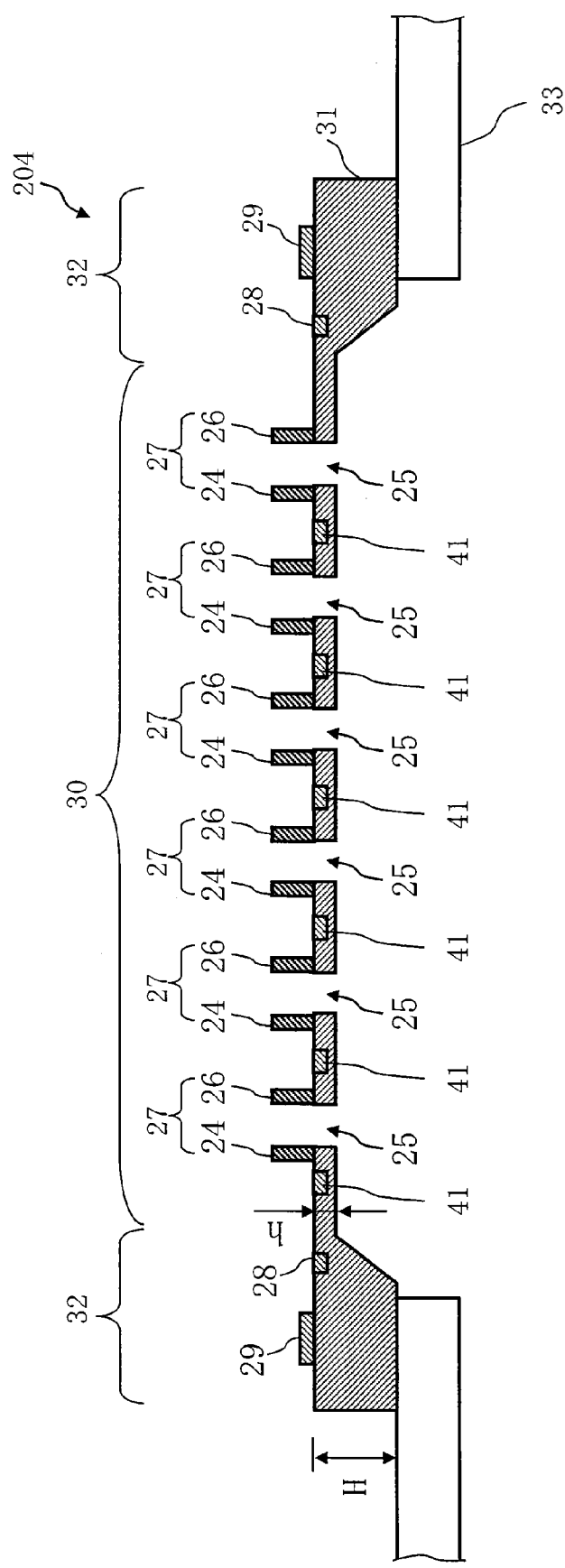
FIG. 3 is a sectional view showing the configuration of a blanking plate according to the first embodiment.
Figure 4:
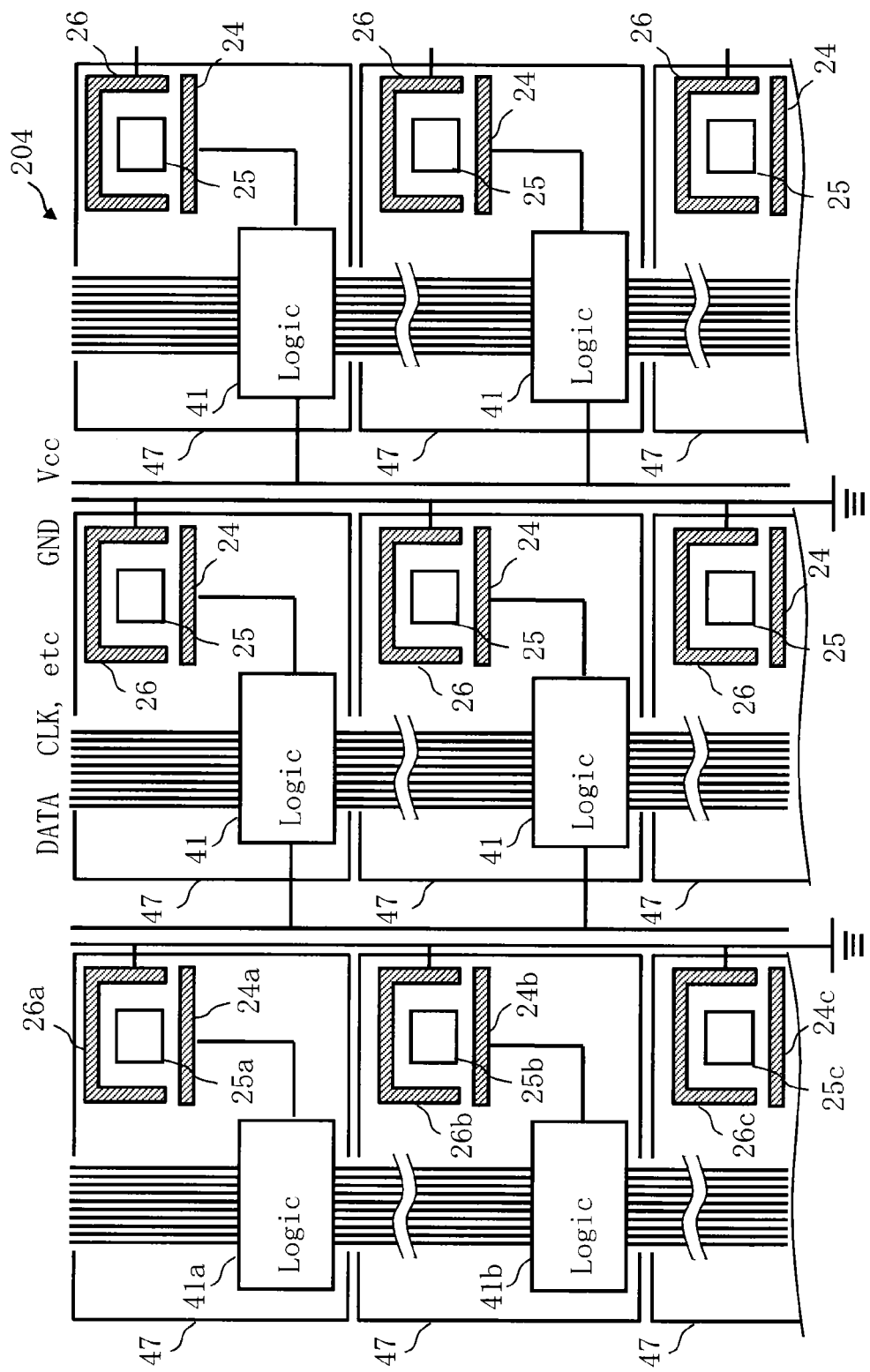
FIG. 4 is a top view conceptual diagram showing a part of the configuration in a membrane region of a blanking plate according to the first embodiment.

FIG. 3 is a sectional view showing the configuration of a blanking plate according to the first embodiment. FIG. 4 is a top view conceptual diagram showing a part of the configuration in a membrane region of a blanking plate according to the first embodiment. In FIGS. 3 and 4, the positions of electrodes 24 and 26 and the position of a control circuit 41 are not in accordance with each other. With regard to the configuration of the blanking plate 204, as shown in FIG. 3, a semiconductor substrate 31 made of silicon, etc. is placed on a support table 33. The central part of the substrate 31 is shaved from the back side and processed to be a membrane region 30 (first region) whose thin film thickness is h. The circumference surrounding the membrane region 30 is a circumference region 32 (second region) whose thick film thickness is H. The upper surface of the membrane region 30 and the upper surface of the circumference region 32 are formed to have equal height positions, or substantially equal height positions. At the backside of the circumference region 32, the substrate 31 is supported to be on the support table 33. The central part of the support table 33 is open, and the position of the membrane region 30 is located in the opening part of the support table 33.

In the membrane region 30, there are formed apertured passage holes 25 (openings) through which multiple beams respectively pass at the positions each corresponding to each hole 22 of the aperture member 203 shown in FIGS. 2A and 2B. In other words, a plurality of passage holes 25, which are arranged in two dimensions and through which multi beams respectively pass, are formed in the membrane region 30 of the substrate 31. Then, as shown in FIGS. 3 and 4, in the membrane region 30, there are arranged blankers 27 (blanking deflectors) each composed of a pair of electrodes, being the electrodes 24 and 26 for blanking deflection, at opposite edge sides of each passage hole 25. Moreover, close to each passage hole 25 in the membrane region 30, there is arranged the control circuit 41 (logic circuit) for applying a deflection voltage to the electrode 24, for example, of each passage hole 25. The other (for example, the electrode 26) of the two electrodes 24 and 26 for each beam is earthed. Moreover, as shown in FIG. 4, for example, a 10-bit parallel wiring for control signals is connected to each control circuit 41. In addition to, for example, the 10-bit parallel wiring, other lines such as the ones for the power source, the control clock, etc. are connected to each control circuit 41. A part of the parallel wiring may be used as the line for the power source. An individual blanking system 47 composed of the electrodes 24 and 26 and the control circuit 41 is configured for each beam of multiple beams. Moreover, a shift register to be described later is arranged in the control circuit 41 for each beam. Thus, a plurality of shift registers and a plurality of blankers are arranged in the membrane region 30 where the film thickness of the substrate 31 is thin.

On the circumference region 32 whose film thickness is thick, a plurality of sets each composed of a serial parallel conversion unit 28 and a pad 29 are arranged as shown in FIG. 3.

The electron beams 20 each pass through a corresponding passage hole are respectively deflected by voltages each independently applied to the pair of the two electrodes 24 and 26. Blanking control is performed by this deflection. In other words, a plurality of blankers 27 each include a pair of electrodes (the electrodes 24 and 26) arranged on the substrate 31 to be at opposite edge sides of a corresponding passage hole 25 in a plurality of passage holes 25, and each provide a blanking deflection to a corresponding beam in multi beams by generating a deflection electric field which is generated by respectively controlling at least one of the pair of electrodes through a shift register for a corresponding beam in a plurality of shift registers. Thus, a plurality of blankers respectively provide a blanking deflection to a corresponding beam in multiple beams respectively having passed through a plurality of holes 22 (openings) of the aperture member 203.

Figure 5A:
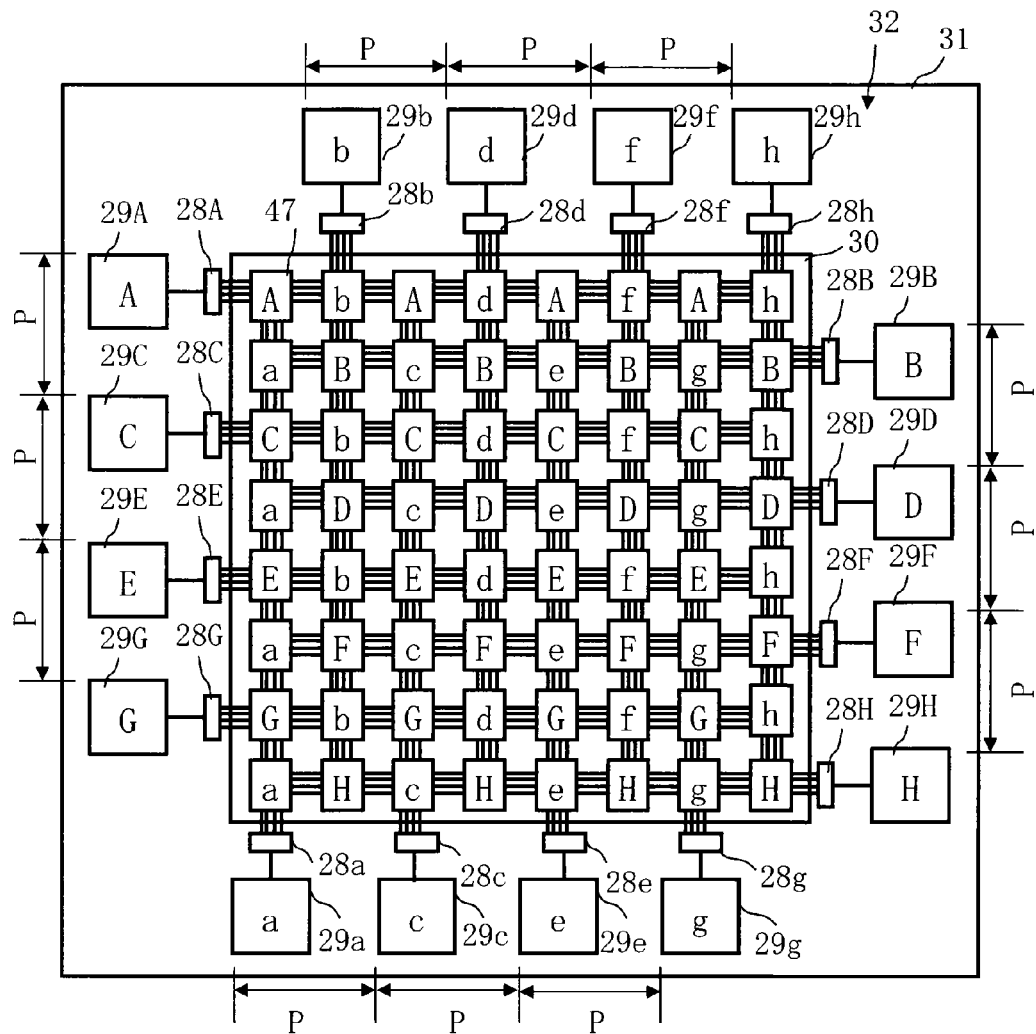
FIG. 5A is a top view showing the configuration of a blanking plate according to the first embodiment.

FIG. 5A is a top view showing the configuration of a blanking plate according to the first embodiment. The substrate 31 is formed in a quadrangle viewed from the above, and the membrane region 30 at the central part is also formed in a quadrangle. A plurality of individual blanking systems 47 are arranged in two dimensions in the membrane region 30. For example, they are arranged in a matrix. A plurality of individual blanking systems 47 arranged in eight rows by eight columns (8×8) are shown in the example of FIG. 5. In the control circuit 41 of each individual blanking system 47, there is arranged a shift register to be described later. A plurality of shift registers for all beams in the membrane region 30 configure a plurality of groups thereof connected in series.

In the example of FIG. 5A, with respect to a plurality of individual blanking systems 47 arranged in each row (lateral direction), one group connected in series is composed of shift registers in a plurality of individual blanking systems 47 arranged in every other column. For example, as shown in FIG. 5, one group connected in series is composed of shift registers in, for example, four individual blanking systems 47 each denoted by "A" in the first row from the top. Similarly, one group connected in series is composed of shift registers in, for example, four individual blanking systems 47 each denoted by "B" in the second row. Similarly, one group connected in series is composed of shift registers in, for example, four individual blanking systems 47 each denoted by "C" in the third row. Similarly, one group connected in series is composed of shift registers in, for example, four individual blanking systems 47 each denoted by "D" in the fourth row. Similarly, one group connected in series is composed of shift registers in, for example, four individual blanking systems 47 each denoted by "E" in the fifth row. Similarly, one group connected in series is composed of shift registers in, for example, four individual blanking systems 47 each denoted by "F" in the sixth row. Similarly, one group connected in series is composed of shift registers in, for example, four individual blanking systems 47 each denoted by "G" in the seventh row. Similarly, one group connected in series is composed of shift registers in, for example, four individual blanking systems 47 each denoted by "H" in the eighth row.

Moreover, in the example of FIG. 5A, in each row, one group is composed of, for example, four individual blanking systems 47 arranged in positions sifted by one column to each other with respect to groups adjacent in the column direction. For example, as shown in FIG. 5, with respect to the groups of four individual blanking systems 47 in the first, third, fifth and seventh rows, each of them is composed of the individual blanking systems 47, for example, in the first, third, fifth, and seventh columns. With respect to the groups of four individual blanking systems 47 in the second, fourth, sixth and eighth rows, each of them is composed of the individual blanking systems 47, for example, in the second, fourth, sixth, and eighth columns.

Moreover, in the example of FIG. 5A, with respect to a plurality of individual blanking systems 47 arranged in each column (vertical direction), one group connected in series is composed of shift registers in a plurality of individual blanking systems 47 arranged in every other row. For example, as shown in FIG. 5, one group connected in series is composed of shift registers in, for example, four individual blanking systems 47 each denoted by "a" in the first column from the left. Similarly, one group connected in series is composed of shift registers in, for example, four individual blanking systems 47 each denoted by "b" in the second column. Similarly, one group connected in series is composed of shift registers in, for example, four individual blanking systems 47 each denoted by "c" in the third column. Similarly, one group connected in series is composed of shift registers in, for example, four individual blanking systems 47 each denoted by "d" in the fourth column. Similarly, one group connected in series is composed of shift registers in, for example, four individual blanking systems 47 each denoted by "e" in the fifth column. Similarly, one group connected in series is composed of shift registers in, for example, four individual blanking systems 47 each denoted by "f" in the sixth column. Similarly, one group connected in series is composed of shift registers in, for example, four individual blanking systems 47 each denoted by "g" in the seventh column. Similarly, one group connected in series is composed of shift registers in, for example, four individual blanking systems 47 each denoted by "h" in the eighth column.

Moreover, in the example of FIG. 5A, in each column, one group is composed of, for example, four individual blanking systems 47 arranged in positions sifted by one row to each other with respect to groups adjacent in the row direction. For example, as shown in FIG. 5, with respect to the groups of four individual blanking systems 47 in the first, third, fifth and seventh columns, each of them is composed of the individual blanking systems 47, in the second, fourth, sixth, and eighth rows. With respect to the groups of four individual blanking systems 47 in the second, fourth, sixth and eighth columns, each of them is composed of the individual blanking systems 47, in the first, third, fifth, and seventh rows. Thus, each group of a plurality of groups is composed of shift registers alternately arranged sandwiching shift registers of different groups in a plurality of shift registers arranged in rows or columns of the two-dimensional arrangement.

With the configuration described above, the individual blanking systems 47 (internal shift registers) are combined such that they are not overlappingly used (not overlapped with each other) between the groups (eight groups in the example of FIG. 5A) in rows and the groups (eight groups in the example of FIG. 5A) in columns.

In each of a plurality of groups composed of a plurality of shift registers connected in series, the shift registers are connected serially by parallel wiring. Then, to each of a plurality of groups composed of a plurality of shift registers connected in series, the serial parallel conversion unit 28 is connected by parallel wiring. A plurality of serial parallel conversion units 28 are arranged along the four sides of the membrane region 30 (quadrangular region) surrounding the whole of a plurality of shift registers.

To each of a plurality of serial parallel conversion units 28, the pad 29 is connected by a single wiring. In other words, each of a plurality of pads 29 is respectively in combination with one of a plurality of serial parallel conversion units 28, and each combination of a pad and a serial parallel conversion unit is connected by single wiring. A plurality of pads 29 are arranged along the four sides of the membrane region 30.

In the example of FIG. 5A, along the left side of the four sides of the membrane region 30, there are arranged a set "A" composed of a serial parallel conversion unit 28A and a pad 29A, a set "C" composed of a serial parallel conversion unit 28C and a pad 29C, a set "E" composed of a serial parallel conversion unit 28E and a pad 29E, and a set "G" composed of a serial parallel conversion unit 28G and a pad 29G. Along the right side of the four sides of the membrane region 30, there are arranged a set "B" composed of a serial parallel conversion unit 28B and a pad 29B, a set "D" composed of a serial parallel conversion unit 28D and a pad 291D, a set "F" composed of a serial parallel conversion unit 28F and a pad 29F, and a set "H" composed of a serial parallel conversion unit 28H and a pad 29H.

Along the upper side of the four sides of the membrane region 30, there are arranged a set "b" composed of a serial parallel conversion unit 28b and a pad 29b, a set "d" composed of a serial parallel conversion unit 28d and a pad 29d, a set "f" composed of a serial parallel conversion unit 28f and a pad 29f, and a set "h" composed of a serial parallel conversion unit 28h and a pad 29h. Along the lower side of the four sides of the membrane region 30, there are arranged a set "a" composed of a serial parallel conversion unit 28a and a pad 29a, a set "c" composed of a serial parallel conversion unit 28c and a pad 29c, a set "e" composed of a serial parallel conversion unit 28e and a pad 29e, and a set "g" composed of a serial parallel conversion unit 28g and a pad 29g.

The serial parallel conversion unit 28A is connected by parallel wiring to the left end shift register of the shift registers in, for example, the four individual blanking systems 47 each denoted by "A" in the first row from the top. The serial parallel conversion unit 28B is connected by parallel wiring to the right end shift register of the shift registers in, for example, the four individual blanking systems 47 each denoted by "B" in the second row from the top. The serial parallel conversion unit 28C is connected by parallel wiring to the left end shift register of the shift registers in, for example, the four individual blanking systems 47 each denoted by "C" in the third row from the top. The serial parallel conversion unit 28D is connected by parallel wiring to the right end shift register of the shift registers in, for example, the four individual blanking systems 47 each denoted by "D" in the fourth row from the top. The serial parallel conversion unit 28E is connected by parallel wiring to the left end shift register of the shift registers in, for example, the four individual blanking systems 47 each denoted by "E" in the fifth row from the top. The serial parallel conversion unit 28F is connected by parallel wiring to the right end shift register of the shift registers in, for example, the four individual blanking systems 47 each denoted by "F" in the sixth row from the top. The serial parallel conversion unit 28G is connected by parallel wiring to the left end shift register of the shift registers in, for example, the four individual blanking systems 47 each denoted by "G" in the seventh row from the top. The serial parallel conversion unit 28H is connected by parallel wiring to the right end shift register of the shift registers in, for example, the four individual blanking systems 47 each denoted by "H" in the eighth row from the top.

The serial parallel conversion unit 28a is connected by parallel wiring to the lower end shift register of the shift registers in, for example, the four individual blanking systems 47 each denoted by "a" in the first column from the left. The serial parallel conversion unit 28b is connected by parallel wiring to the upper end shift register of the shift registers in, for example, the four individual blanking systems 47 each denoted by "b" in the second column from the left. The serial parallel conversion unit 28c is connected by parallel wiring to the lower end shift register of the shift registers in, for example, the four individual blanking systems 47 each denoted by "c" in the third column from the left. The serial parallel conversion unit 28d is connected by parallel wiring to the upper end shift register of the shift registers in, for example, the four individual blanking systems 47 each denoted by "d" in the fourth column from the left. The serial parallel conversion unit 28e is connected by parallel wiring to the lower end shift register of the shift registers in, for example, the four individual blanking systems 47 each denoted by "e" in the fifth column from the left. The serial parallel conversion unit 28f is connected by parallel wiring to the upper end shift register of the shift registers in, for example, the four individual blanking systems 47 each denoted by "f" in the sixth column from the left. The serial parallel conversion unit 28g is connected by parallel wiring to the lower end shift register of the shift registers in, for example, the four individual blanking systems 47 each denoted by "g" in the seventh column from the left. The serial parallel conversion unit 28h is connected by parallel wiring to the upper end shift register of the shift registers in, for example, the four individual blanking systems 47 each denoted by "h" in the eighth column from the left.

Figure 5B:
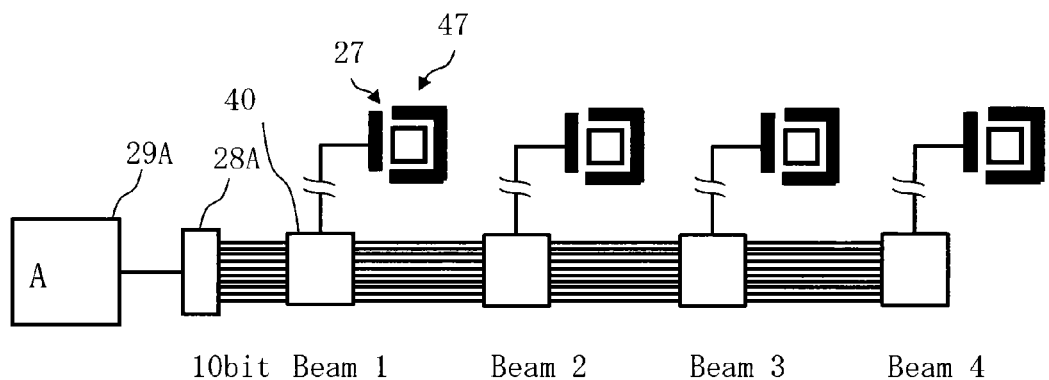
FIG. 5B shows an example of a connection state of shift registers according to the first embodiment.

For the sake of simplification, the serial parallel conversion unit 28 and the shift register are connected with each other by a 4-bit parallel line in the example of FIG. 5A, but, they are connected by a line whose number of bits is the same as that shown in FIG. 4, for example, by a 10-bit parallel line. FIG. 5B shows an example of a connection state of shift registers according to the first embodiment. In FIG. 5B, circuits other than the shift registers 40 in the control circuits 41 are not shown. FIG. 5B shows, for example, the case where all of the shift registers 40 in the four individual blanking systems 47 each denoted by "A" in the first row from the top in FIG. 5A are connected in series by a 10-bit parallel line. The serial parallel conversion unit 28 is connected to one (the shift register 40 at the end close to the serial parallel conversion unit 28) of shift registers of groups in each row, by a 10-bit parallel line. In the case of 5B, respective beams passing through, for example, the four individual blanking systems 47 each denoted by "A" in the first row are defined, such as, beam 1, beam 2, . . . , from the one close to the serial parallel conversion unit 28. In the case of the configuration shown in FIG. 5B, when four individual blanking systems 47 are arranged as the ones each denoted by "A" in the first row, it is necessary to perform clock operations of four times in order to transmit a blanking signal up to beam 4 by using the shift registers 40. Therefore, clock operations of four times are needed for one beam shot in the example of FIG. 5B. Thus, a plurality of groups of shift registers arranged in two dimensions and connected in series are configured by forming a plurality of shift registers 40 each to be close to a corresponding passage hole 25 in a plurality of passage holes 25 on the substrate 31.

As described above, according to the first embodiment, it is possible to arrange a plurality of sets each composed of the serial parallel conversion unit 28 and the pad 29 along the four sides of the membrane region 30 (quadrangular region) while dividing the groups of the shift registers connected in series into groups in rows and groups in columns such that they are not overlapped with each other. Moreover, as described above, since the four sides of the membrane region 30 (quadrangular region) can be utilized, it is possible to increase the region where the sets of the serial parallel conversion units 28 and the pads 29 can be arranged, compared with the case of utilizing only one side or two sides. Therefore, even when the number of beams of multiple beams increases, a plurality of sets each composed of the serial parallel conversion unit 28 and the pad 29 can be arranged.

Moreover, according to the first embodiment, the distance between the serial parallel conversion unit 28 of the pad 29 of each set can be equalized with each other. Therefore, the signal transmission speed of each set of the serial parallel conversion unit 28 and the pad 29 can be the same as each other. Accordingly, it is possible to avoid a signal delay.

Moreover, according to the first embodiment, each distance between the serial parallel conversion unit 28 and the shift register arranged at the end in a group of corresponding shift registers can be approximately equalized with each other. Therefore, the signal transmission speed from the serial parallel conversion unit 28 to a corresponding shift register connected in series of each group can be the same as each other. Accordingly, it is possible to avoid a signal delay.

The blankers and the control circuits are manufactured using the LSI manufacturing technology. Although parallel wiring cross each other in the membrane region 30, what is necessary is just to form parallel wiring in different layers for groups (eight groups in the example of FIG. 5) each for each row, and for groups (eight groups in the example of FIG. 5) each for each column.

Moreover, as shown in FIG. 5, a plurality of sets each composed of the pad 29 and the serial parallel conversion unit 28 are arranged at the same pitch length at each of the four sides of the membrane region 30. At each of the four sides, a plurality of sets each composed of the pad 29 and the serial parallel conversion unit 28 are arranged at $2n$ (n being a natural number) times the beam pitch being an arrangement pitch between beams of multiple beams. In the example of FIG. 5, they are arranged at twice the beam pitch. It becomes possible to arrange more number of a plurality of sets each composed of the pad 29 and the serial parallel conversion unit 28 by equalizing the arrangement pitch at each side. Consequently, even when the number of beams of multiple beams increases, a plurality of sets each composed of the serial parallel conversion unit 28 and the pad 29 can be arranged.

Moreover, as shown in FIG. 5, the same number of a plurality of sets each composed of the pad 29 and the serial parallel conversion unit 28 are arranged at each of the four sides of the membrane region 30. It becomes possible to arrange more number of a plurality of sets each composed of the pad 29 and the serial parallel conversion unit 28 by equalizing the arrangement number at each side. Consequently, even when the number of beams of multiple beams increases, a plurality of sets each composed of the serial parallel conversion unit 28 and the pad 29 can be arranged.

Figure 6A:
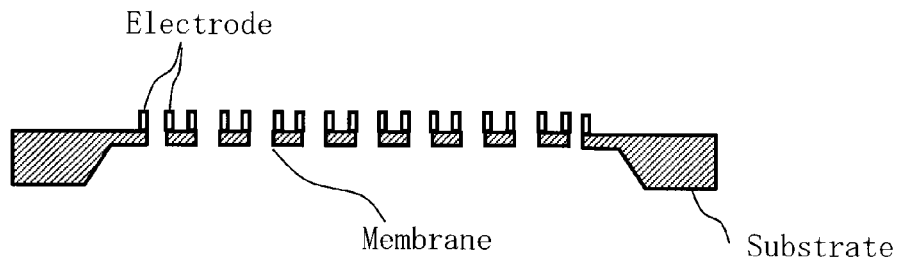
FIGS. 6A and 6B are top views showing the configuration of a blanking plate used as a comparative example A of the first embodiment.
Figure 6B:
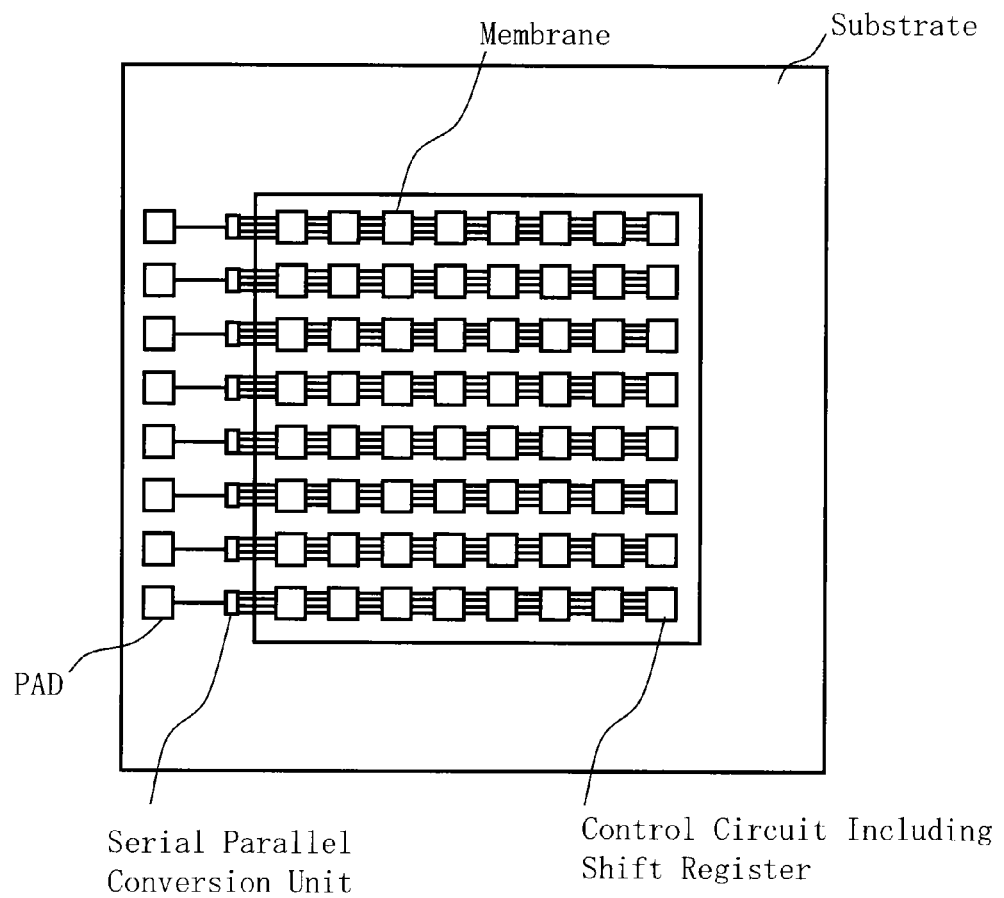

FIGS. 6A and 6B are top views showing the configuration of a blanking plate used as a comparative example A of the first embodiment. FIG. 6A, similarly to FIG. 3, shows an example of a blanking plate where a substrate is formed in a quadrangle viewed from the above, and a membrane region at the central part is also formed in a quadrangle. With respect to shift registers of a plurality of individual blanking systems arranged in a matrix, the comparative example A of FIG. 6B shows the case where, in each row, all the shift registers arranged in a row concerned are connected in series. In the comparative example A of FIG. 6B, the sets each composed of a serial parallel conversion circuit and a pad are arranged only at one side, for example the left side, of the four sides of the membrane region, where each of the sets is for a group of the shift registers in each row. According to the configuration of this comparative example A, if the number of rows increases because the number of beams increases, it becomes difficult to arrange the sets each composed of the serial parallel conversion unit and the pad at one side of the blanking plate to be in accordance with the number of rows. For example, if a beam arrangement is 512×512, the beam pitch is about 32 μm, and therefore, it becomes difficult to arrange them because the distance between pads is too narrow. Moreover, in the comparative example A of FIG. 6B, since all the shift registers in each row are connected in series, if the number of beams increases, the number of shift registers arranged in one row increases. Therefore, data transmission will take time.

By contrast, according to the first embodiment, since groups each composed of a serial parallel conversion unit and a pad are arranged at the four sides of the membrane region 30, the problem of it being difficult to arrange the groups because the distance between pads is too narrow can be solved. Moreover, according to the first embodiment, since all of the shift registers arranged in each row are not connected in series but a part of them are connected in series, even if the number of beams increases and the number of shift registers arranged in one row increases, it is possible to suppress the increase in the number of shift registers connected in series in each group. Therefore, the time taken in transmitting data can be reduced. Accordingly, high-speed operation can be achieved.

Figures 7A, 7B:
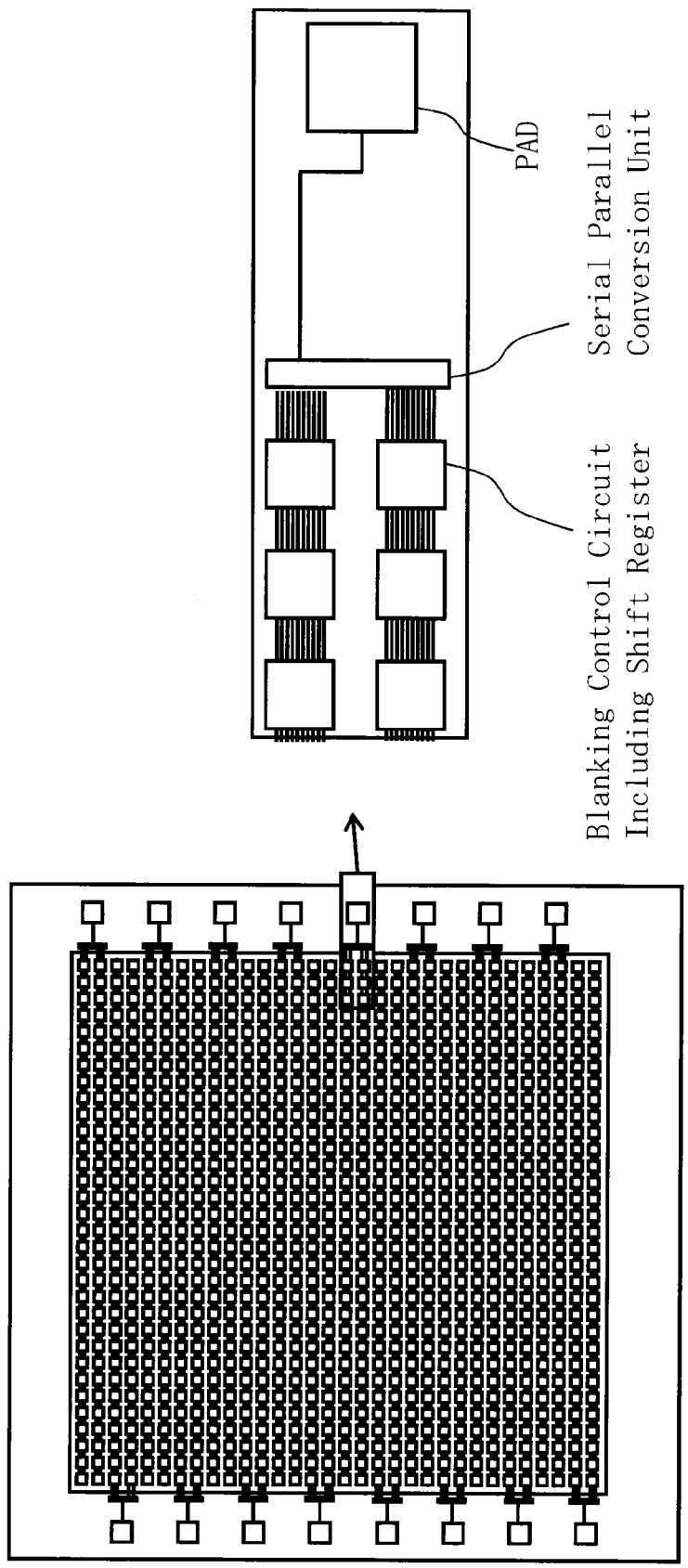
FIGS. 7A and 7B are top views showing the configuration of a blanking plate used as a comparative example B of the first embodiment.

FIGS. 7A and 7B are top views showing the configuration of a blanking plate used as a comparative example B of the first embodiment. With respect to shift registers of a plurality of individual blanking systems arranged in a matrix, the comparative example B of FIG. 7A shows the case where, in each row, all the shift registers arranged in a row concerned are connected in series. In the comparative example B of FIG. 7A, as shown in FIG. 7B, one set of a serial parallel conversion circuit and a pad is connected to each group of shift registers arranged in two rows. In this example, for each two rows, groups each composed of a serial parallel conversion circuit and a pad are alternately arranged at the two, right and left, sides of the four sides of the membrane region. According to the comparative example B of FIG. 7A, since each group of shift registers in each two rows is connected to each one set of a serial parallel conversion circuit and a pad, the number of sets each composed of a serial parallel conversion circuit and a pad can be reduced. Moreover, by using the two, right and left, sides of the four sides of the membrane region are used, the arrangement space between the groups each composed of a serial parallel conversion circuit and a pad can be a sufficient space. However, since all the shift registers arranged in each row are connected in series, if the number of beams increases, the number of shift registers arranged in one row will increase. Moreover, since data of each group of shift registers in two rows is transmitted from one pad by serial transmission, it will take time to transmit a signal from the pad to the serial parallel conversion circuit, and therefore, data transmission will also take time.

By contrast, according to the first embodiment, since sets each composed of a serial parallel conversion unit and a pad are arranged at the four sides of the membrane region 30, more space sufficiency can be obtained than the comparative example B of FIG. 7A. Moreover, according to the first embodiment, since all of the shift registers arranged in each row are not connected in series but a part of them are connected in series, even if the number of beams increases and the number of shift registers arranged in one row increases, it is possible to suppress the increase in the number of shift registers connected in series in each group. Furthermore, according to the first embodiment, since the number of shift registers of which one pad takes charge is much fewer (for example, one-fourth) than the comparative example B of FIG. 7A, data amount to be transmitted from the pad by serial transmission is small. Therefore, the time taken in transmitting data can be reduced. Accordingly, high-speed operation can be achieved.

FIGS. 8A and 8B are top views showing the configuration of a blanking plate used as a comparative example C of the first embodiment. With respect to shift registers of a plurality of individual blanking systems arranged in a matrix, the comparative example C of FIG. 8A shows the case where, in each row, all the shift registers arranged in a row concerned are connected in series. In the comparative example C of FIG. 8A, as shown in FIG. 8B, one set of a serial parallel conversion circuit and a pad is connected to each group of shift registers arranged in one row. Pads are arranged at the four sides of the membrane region. The arrangement pitch of the set of a serial parallel conversion circuit and a pad is the same as that of FIG. 7A or 7B. In the comparative example C of FIG. 8A, since there exist only the sets each composed of a serial parallel conversion circuit and a pad exist for each row, the length of single wiring from the pads arranged especially at the upper side or the lower side of the four sides of the membrane region to a corresponding serial parallel conversion circuit is long, and therefore, the wiring lengths from the pads for the groups of the shift registers are inconsistent with each other. This causes a signal delay. Thus, in the comparative example C of FIG. 8A, the wiring length and the amount of signal delay for each pad differs from each other. Therefore, it is difficult to achieve high-speed operation.

By contrast, according to the first embodiment, the sets each composed of a serial parallel conversion unit and a pad, arranged along the upper side or the lower side of the four sides of the membrane region 30, are connected to a group of shift registers in each column, and the sets each composed of a serial parallel conversion unit and a pad, arranged along the left side or the right side, are connected to a group of shift registers in each row. Therefore, it is not necessary to provide a long single wiring from the pad 29 to a corresponding serial parallel conversion unit 28. Furthermore, it is possible to shorten the length of single wiring from the pad 29 to a corresponding serial parallel conversion unit 28. Therefore, signal delay can be further reduced. Moreover, according to the first embodiment, since the sets each composed of a serial parallel conversion unit and a pad are arranged at the four sides of the membrane region 30, and, further, the wiring length from a pad to a corresponding serial parallel conversion unit can be equalized with each other, it is possible to suppress the irregularity of the signal delay amount. Accordingly, high-speed operation can be achieved.

Figures 9A, 9B:
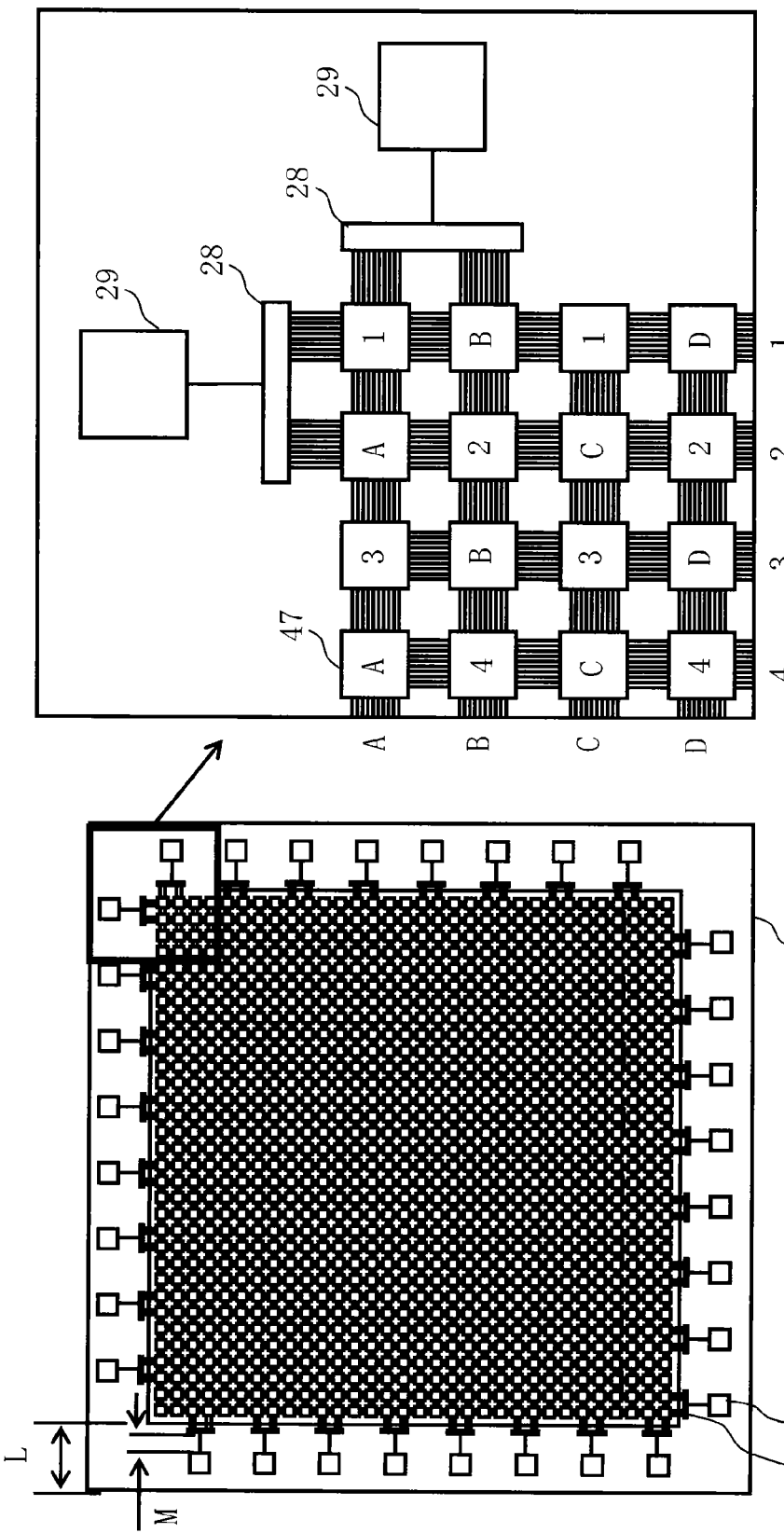
FIGS. 9A and 9B are top views showing the configuration of a blanking plate used as a modified example of the first embodiment.

FIGS. 9A and 9B are top views showing the configuration of a blanking plate used as a modified example of the first embodiment. In the modification of FIG. 9A, similarly to FIG. 5, shift registers connected in series are divided into groups (sixteen groups in the example of FIG. 9A) for each row and groups (sixteen groups in the example of FIG. 9A) for each column. Similarly to FIG. 5, shift registers are combined such that they are not overlappingly used (not overlapped with each other) between the groups each for each row and the groups each for each column. In the modified example of FIG. 9A, differing from FIG. 5, the sets each composed of the serial parallel conversion unit 28 and the pad 29 arranged at the upper side or the lower side of the four sides of the membrane region 30 are respectively connected to two groups in a plurality of groups each for each column, as shown in FIG. 9B. Thereby, in the modified example of FIG. 9A, the number of sets each composed of the serial parallel conversion unit 28 and the pad 29 is reduced one-half compared with the configuration shown in FIG. 5. Therefore, further, it can cope with the increase in the number of beams. However, since the number of shift registers assigned to one pad 29 doubles, data transmission speed becomes slow compared with the configuration shown in FIG. 5.

However, since the number of shift registers assigned to one pad 29 is few compared with the comparative example B of FIG. 7A, it is possible to speed up the data transmission speed compared with the comparative example B of FIG. 7A. Moreover, in the modified example of FIG. 9A, similarly to the configuration shown in FIG. 5, the sets each composed of a serial parallel conversion unit and a pad, arranged along the upper side or the lower side of the four sides of the membrane region 30, are connected to a group of shift registers in each column, and the sets each composed of a serial parallel conversion unit and a pad, arranged along the left side or the right side of the four sides, are connected to a group of shift registers in each row. Therefore, it is not necessary to provide a long single wiring from the pad 29 to a corresponding serial parallel conversion unit 28. As shown in FIG. 9A, a distance M from the pad 29 to a corresponding serial parallel conversion unit 28 can be shorter than a distance L from the end of the substrate 31 of the blanking plate 204 to the end (side) of the membrane region 30. Furthermore, it is possible to shorten the length of single wiring from the pad 29 to a corresponding serial parallel conversion unit 28. Therefore, signal delay can be further reduced. Moreover, according to the first embodiment, since the sets each composed of a serial parallel conversion unit and a pad are arranged at the four sides of the membrane region 30, and, further, the wiring length from a pad to a corresponding serial parallel conversion unit can be equalized with each other, it is possible to suppress the irregularity of the signal delay amount. Accordingly, high-speed operation can be achieved.

Figure 10:
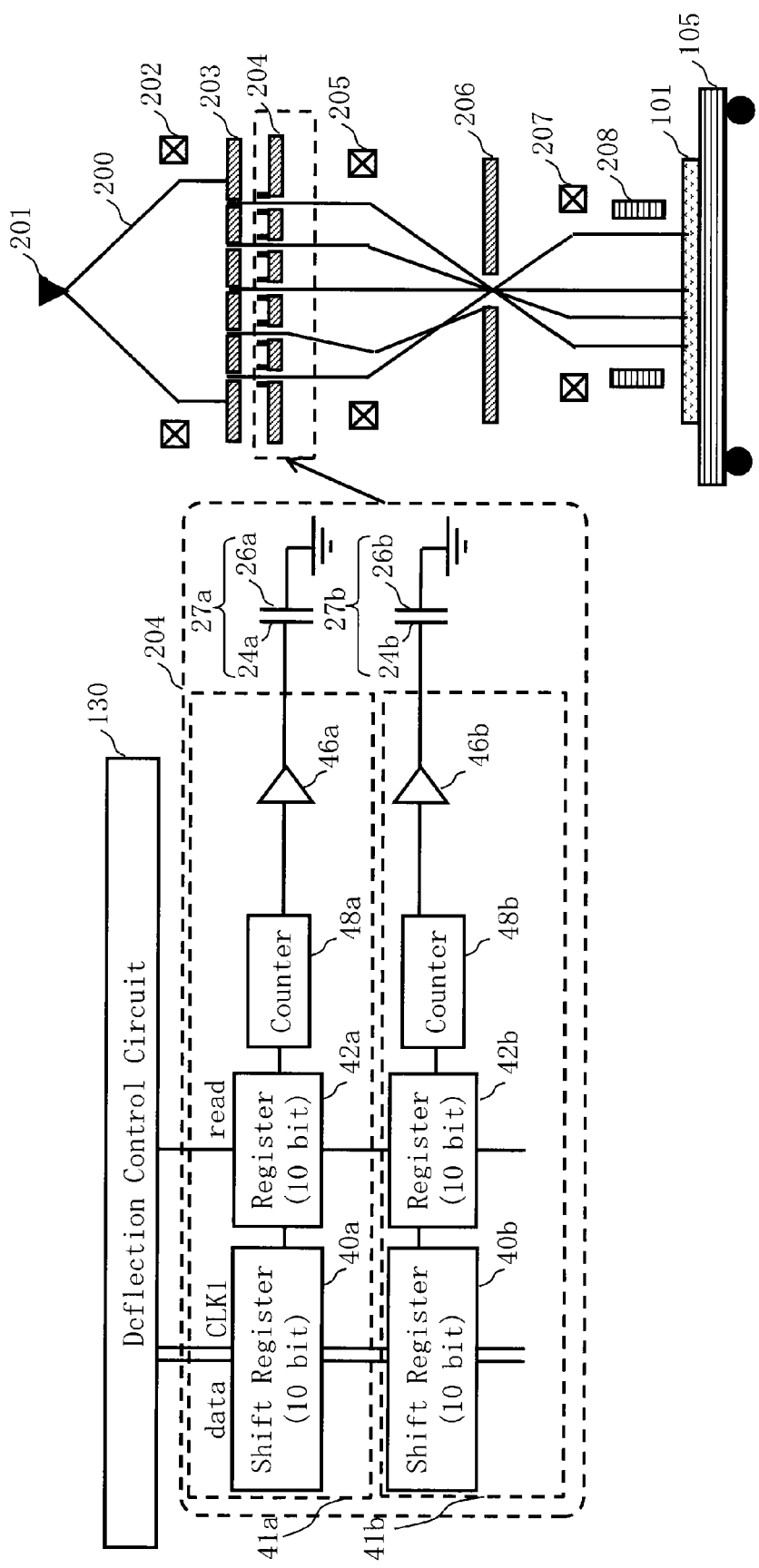
FIG. 10 is a schematic diagram showing the internal configuration of an individual blanking control circuit according to the first embodiment.

FIG. 10 is a schematic diagram showing the internal configuration of an individual blanking control circuit according to the first embodiment. In FIG. 10, in each control circuit 41 for individual blanking control arranged at the blanking plate 204 inside the body of the writing apparatus 100, there are arranged a shift register 40, a register 42, a counter 48, and an amplifier 46. A plurality of blankers 27 each include a pair of electrodes (the electrodes 24 and 26) arranged on the substrate 31 to be at opposite edge sides of a corresponding passage hole 25 in a plurality of passage holes 25, and each provide a blanking deflection to a corresponding beam in multi beams by generating a deflection electric field which is generated by respectively controlling at least one of the pair of electrodes through a shift register for a corresponding beam in a plurality of shift registers. According to the first embodiment, individual blanking control for each beam is controlled by a 10-bit control signal, for example. As shown in FIG. 10, when mounting the blanking plate 204 shown in FIG. 3 in the writing apparatus 100, it is preferable to arrange the surface, where the control circuit 41 and the electrodes 24 and 26 are formed, to be upward.

Figure 11:
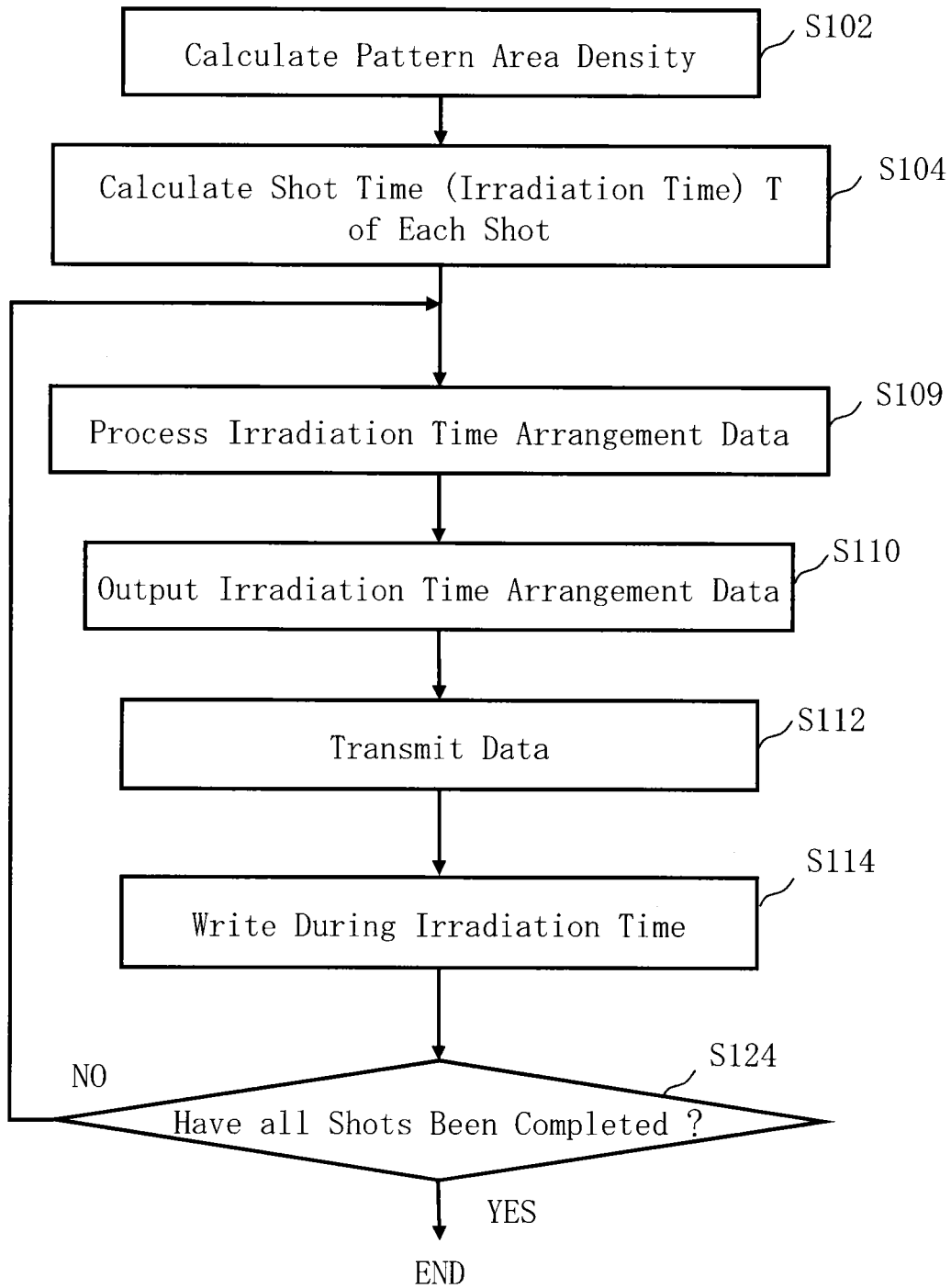
FIG. 11 is a flowchart showing main steps of a writing method according to the first embodiment.

FIG. 11 is a flowchart showing main steps of a writing method according to the first embodiment. In FIG. 11, the writing method of the first embodiment executes a series of steps: a pattern area density calculation step (S102), a shot time (irradiation time) T calculation step (S104), an irradiation time arrangement data processing step (S109), an irradiation time arrangement data output step (S110), a data transmission step (S112), a writing step (S114), and a determination step (S124).

In the pattern area density calculation step (S102), the area density calculation unit 60 reads writing data from the storage device 140, and calculates the area density of a pattern arranged in the writing region of the target object 101 or in each mesh region of a plurality of mesh regions obtained by virtually dividing a chip region to be written into meshes. For example, the writing region of the target object 101 or a chip region to be written is divided into strip-shaped stripe regions each having a predetermined width. Then, each stripe region is virtually divided into a plurality of mesh regions described above. It is preferable that the size of a mesh region is, for example, a beam size, or smaller than a beam size. For example, the size of a mesh region is preferably about 10 nm. The area density calculation unit 60 reads corresponding writing data from the storage device 140 for each stripe region, and assigns a plurality of figure patterns defined in the writing data to a mesh region, for example. Then, the area density of a figure pattern arranged in each mesh region should be calculated.

In the shot time (irradiation time) T calculation step (S104), the irradiation time calculation unit 62 calculates an irradiation time T (which hereinafter will also be called a shot time, a shot time period, or an exposure time) of the electron beam per shot, for each predetermined sized mesh region. When performing multi-pass writing, an irradiation time T of the electron beam per shot in each hierarchy of multi-pass writing should be calculated. It is preferable to obtain an irradiation time T, being a reference, to be in proportion to the area density of a calculated pattern. Moreover, it is preferable that the irradiation time T to be finally calculated is a time equivalent to a dose after correction, that is a dose having been corrected with respect to a dimension change amount for a phenomenon causing dimension variations, such as a proximity effect, a fogging effect, a loading effect, etc. not shown. The size of a plurality of mesh regions for defining the irradiation time T and the size of a plurality of mesh regions where a pattern area density is defined may be the same size or different sizes. When they are different sizes, each irradiation time T is calculated after interpolating an area density by linear interpolation, etc. The irradiation time T for each mesh region is defined in an irradiation time map, and the irradiation time map is stored in the storage device 142, for example.

In the irradiation time arrangement data processing step (S109), the data processing unit 64 reads data of an irradiation time for a mesh region to be irradiated with each beam, stored in the storage device 142, converts the data of the irradiation time of a corresponding beam to 10-bit data, for each group of a plurality of shift registers connected in series, and performs processing so that the data may be aligned according to the order to be transmitted by a plurality of shift registers 40 of a corresponding group. The arrangement processing is performed so that the data may be aligned in order from the data for a shift register at the posterior side in a plurality of shift registers connected in series in the group.

In the irradiation time arrangement data output step (S110), the transmission processing unit 68 outputs, for each beam shot, irradiation time arrangement data whose order has been processed to be in accordance with the order of a plurality of groups of shift registers connected in series, to the deflection control circuit 130.

In the data transmission step (S112), the deflection control circuit 130 outputs, for each shot, irradiation time arrangement data to the control circuit 41 corresponding to each group of arranged shift registers connected in series. The irradiation time arrangement data is serially transmitted.

According to the first embodiment, as shown in FIG. 10, since the shift register 40 is used in the control circuit 41, the deflection control circuit 130 transmits, in the case of data transmission, each 10-bit data configuring the same group to the pad 29 of each set of the blanking plate 204 in order of arrangement (or in order of identification numbers) of the shift registers 40 connected in series. Each pad 29 outputs signals, having been serially transmitted, to a corresponding serial parallel conversion unit 28. Each serial parallel conversion unit 28 converts the signal having been serially transmitted into a 10-bit parallel signal for each beam, and performs data transmission of the 10-bit parallel signal to a corresponding control circuit 41. Moreover, a clock signal (CLK1) for synchronization and a read signal (read) for data read-out are also output. The shift register 40 of each beam transmits, according to a clock signal (CLK1), data 10 bits by 10 bits in order from the higher side to a next shift register 40 sequentially.

Next, when inputting a read signal (read), the register 42 for each beam reads data of each beam from the shift register 40. When inputting 10-bit data, the individual register 42 for each beam outputs an ON/OFF signal to the counter 48, based on the data. If the signal from the register 42 is ON, the counter 48 counts an irradiation time and outputs an ON signal to the amplifier 46 during the irradiation time. While receiving the ON signal, the amplifier 46 applies an ON voltage to the electrode 24 of the individual blanking deflector. In other cases, the counter 48 outputs an OFF signal to the amplifier 46, and the amplifier 46 applies an OFF voltage to the electrode 24 of the individual blanking deflector.

In the writing step (S114), the writing unit 150 performs writing during an irradiation time concerned, for each beam shot. Specifically, it operates as follows.

The electron beam 200 emitted from the electron gun assembly 201 (emission unit) almost perpendicularly illuminates the whole of the aperture member 203 by the illumination lens 202. A plurality of holes (openings), each being a quadrangle, are formed in the aperture member 203. The region including all the plurality of holes is irradiated with the electron beam 200. For example, a plurality of quadrangular electron beams (multiple beams) 20a to 20e are formed by letting parts of the electron beam 200 irradiating the positions of a plurality of holes pass through a corresponding hole of the plurality of holes of the aperture member 203 respectively. The multiple beams 20a to 20e respectively pass through a corresponding blanker (first deflector: individual blanking system) of the blanking plate 204. Each blanker respectively deflects (performs blanking deflection) the electron beam 20 passing individually.

The multiple beams 20a, 20b, . . . , 20e, having passed through the blanking plate 204 are reduced by the reducing lens 205, and go toward the hole at the center of the limiting aperture member 206. At this stage, the electron beam 20 which was deflected by the blanker of the blanking plate 204 deviates from the hole of the center of the limiting aperture member 206 (blanking aperture member) and is blocked by the limiting aperture member 206. On the other hand, the electron beam 20 which was not deflected by the blanker of the blanking plate 204 passes through the hole at the center of the limiting aperture member 206, as shown in FIG. 1. Blanking control is performed by ON/OFF of the individual blanking system so as to control ON/OFF of the beam. Thus, the limiting aperture member 206 blocks each beam which was deflected to be a beam OFF state by the individual blanking system. Then, one beam shot is formed by beams having been made during from a beam ON state to a beam OFF state and having passed through the limiting aperture member 206. The multi-beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 so as to irradiate respective beam irradiation positions on the target object 101. While the XY stage 105 is continuously moving, controlling is performed by the deflector 208 so that irradiation positions of beams may follow the movement of the XY stage 105, for example. The position of the XY stage 105 is measured by using a reflected light which is obtained by irradiating a laser onto the mirror 210 on the XY stage 105 from the stage position detector 139. Ideally, multi-beams 20 to irradiate at a time are aligned at pitches obtained by multiplying the arrangement pitch of a plurality of holes of the aperture member 203 by a desired reduction ratio described above. The writing apparatus 100 performs a writing operation by the raster scan method which continuously irradiates shot beams in order, and when writing a desired pattern, a required beam is controlled by blanking control to be ON according to the pattern.

In the determination step (S124), the writing control unit 72 determines whether all the shots have been completed. If all the shots have been completed, it ends. If all the shots have not been completed yet, it returns to the irradiation time arrangement data processing step (S109), and the steps from the irradiation time arrangement data processing step (S109) to the determination step (S124) are repeated until all the shots have been completed.

Figure 12:
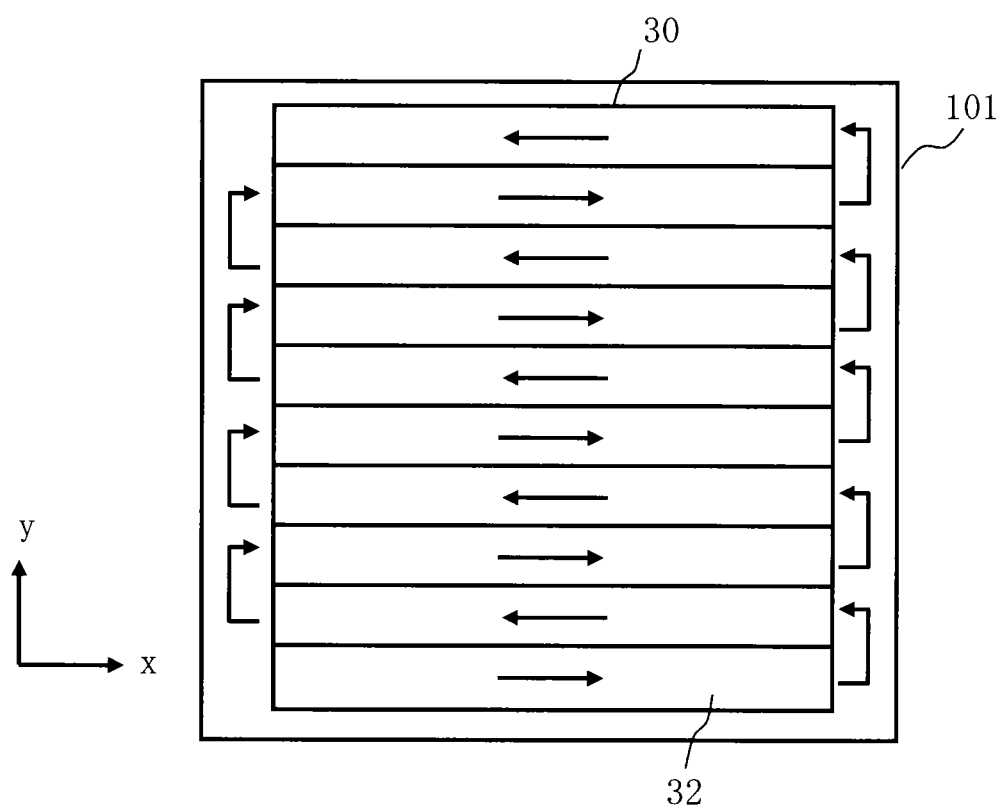
FIG. 12 is a conceptual diagram explaining a writing operation according to the first embodiment.

FIG. 12 is a conceptual diagram explaining a writing operation according to the first embodiment. As shown in FIG. 12, a writing region 30 of the target object 101 is virtually divided into a plurality of strip-shaped stripe regions 32 each having a predetermined width in the y direction, for example. Each of the stripe regions 32 serves as a writing unit region. The XY stage 105 is moved and adjusted such that an irradiation region 34 to be irradiated with one-time irradiation of the multi-beams 20 is located at the left end of the first stripe region 32 or at a position more left than the left end, and then writing is started. When writing the first stripe region 32, the writing advances relatively in the x direction by moving the XY stage 105 in the −x direction, for example. The XY stage 105 is continuously moved at a predetermined speed, for example. After writing the first stripe region 32, the stage position is moved in the −y direction and adjusted such that the irradiation region 34 is located at the right end of the second stripe region 32 or at a position more right than the right end and located to be relatively in the y direction. Then, similarly, writing advances in the −x direction by moving the XY stage 105 in the x direction, for example. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also acceptable to perform writing in the same direction when writing each stripe region 32. By one shot, a plurality of shot patterns of the same number as the holes 22 are formed at a time by multiple beams which have been formed by passing through respective corresponding holes 22 of the aperture member 203.

Figure 13A:
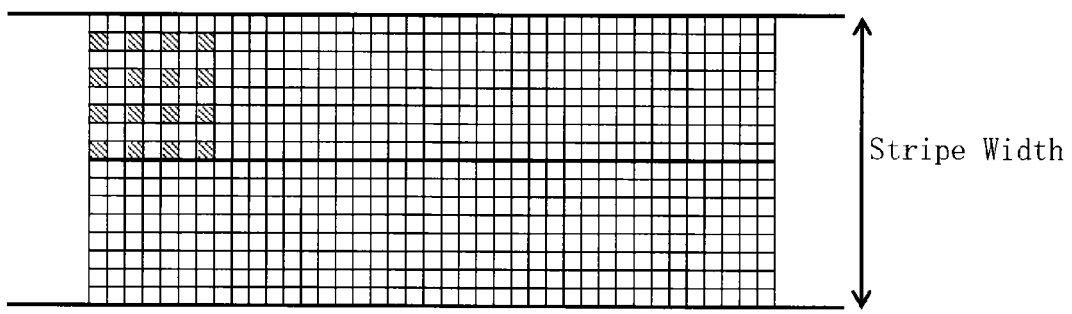
FIGS. 13A to 13C are conceptual diagrams explaining examples of a writing operation in a stripe according to the first embodiment.
Figure 13B:
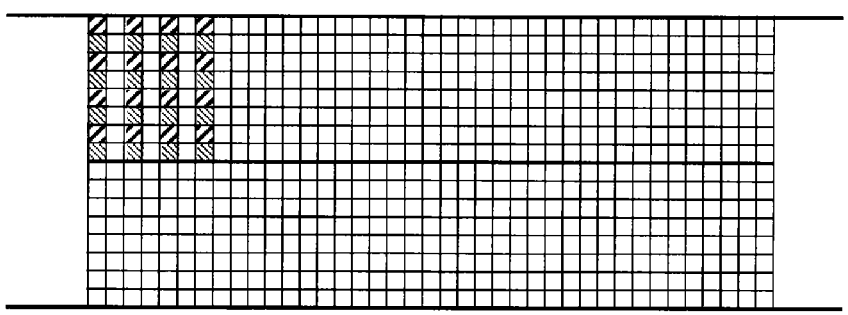
Figure 13C:
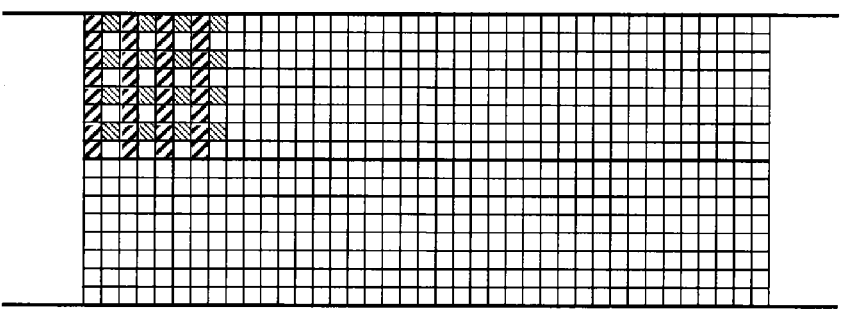

FIGS. 13A to 13C are conceptual diagrams explaining examples of a writing operation in a stripe according to the first embodiment. The examples of FIGS. 13A to 13C show the cases where writing is performed in a stripe by using multiple beams of 4×4 in the x and y directions, for example. The examples of FIGS. 13A to 13C show the cases where a stripe region is divided in the y direction by twice the width of an irradiation region of the whole multi-beam, for example. There is shown the case where exposure (writing) of one irradiation region of the whole of multiple beams is completed by four shots (one shot is a total of a plurality of irradiation steps) performed while shifting the irradiation position by one mesh in the x direction or the y direction. First, the upper region of the stripe region is to be written. FIG. 13A shows the mesh region irradiated by the first one-shot (one shot is a total of a plurality of irradiation steps). Next, as shown in FIG. 13B, the second one-shot (one shot is a total of a plurality of irradiation steps) is performed while shifting the position in the y direction to the mesh region not having been irradiated yet. Next, as shown in FIG. 13C, the third one-shot (one shot is a total of a plurality of irradiation steps) is performed while shifting the position in the x direction to the mesh region not having been irradiated yet.

Figure 14A:
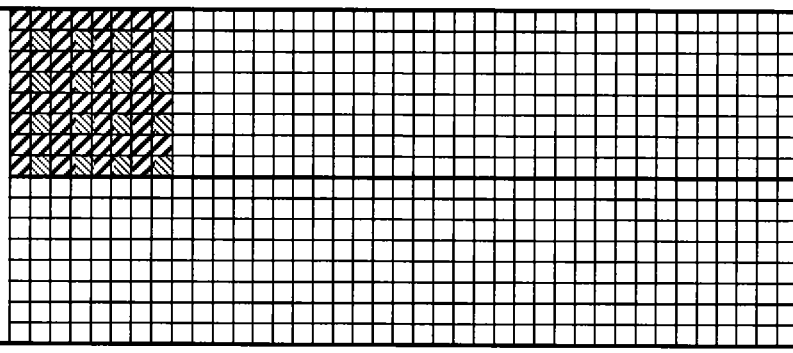
FIGS. 14A to 14C are conceptual diagrams explaining examples of a writing operation in a stripe according to the first embodiment.
Figure 14B:
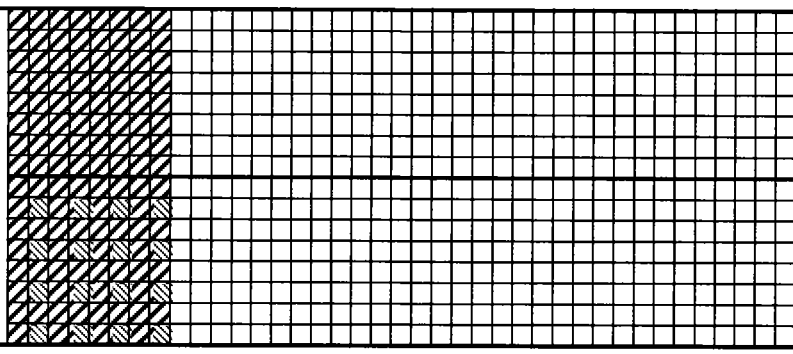
Figure 14C:
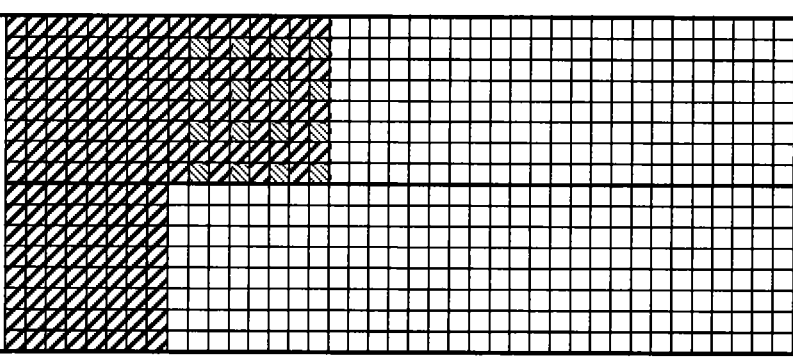

FIGS. 14A to 14C are conceptual diagrams explaining examples of a writing operation in a stripe according to the first embodiment. FIGS. 14A to 14C are continued from FIG. 13C. As shown in FIG. 14A, the fourth one-shot (one shot is a total of a plurality of irradiation steps) is performed while shifting the position in the y direction to the mesh region not having been irradiated yet. Exposure (writing) of one irradiation region of the whole of multiple beams is completed by these four shots (one shot is a total of a plurality of irradiation steps). Next, the lower region of the stripe region is to be written. As shown in FIG. 14B, the lower region of the stripe region is irradiated by the first one-shot (one shot is a total of a plurality of irradiation steps). Next, the second one-shot (one shot is a total of a plurality of irradiation steps) is performed while shifting the position in the y direction to the mesh region not having been irradiated yet. Next, the third one-shot (one shot is a total of a plurality of irradiation steps) is performed while shifting the position in the x direction to the mesh region not having been irradiated yet. The fourth one-shot (one shot is a total of a plurality of irradiation steps) is performed while shifting the position in the y direction to the mesh region not having been irradiated yet. By the operations described above, writing of the first column of the irradiation region of multiple beams in the stripe region is completed. Then, as shown in FIG. 14C, writing is to be similarly performed for the second column of the multiple beam irradiation region while shifting the position in the x direction. The whole stripe region can be written by repeating the operations described above.

Figure 15A:
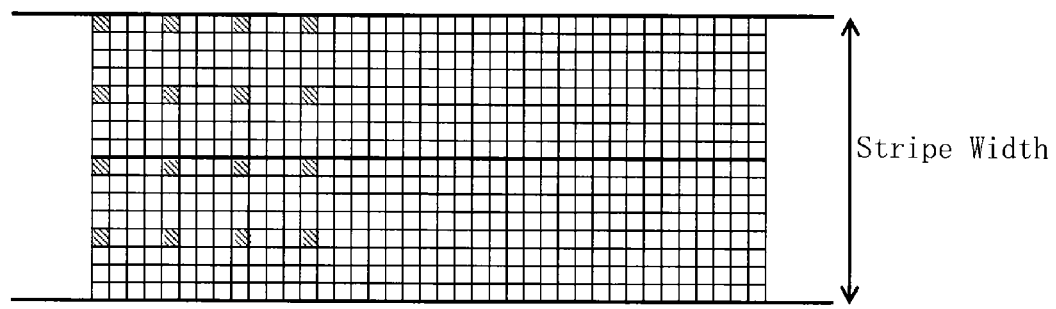
FIGS. 15A to 15C are conceptual diagrams explaining other examples of a writing operation in a stripe according to the first embodiment.
Figure 15B:
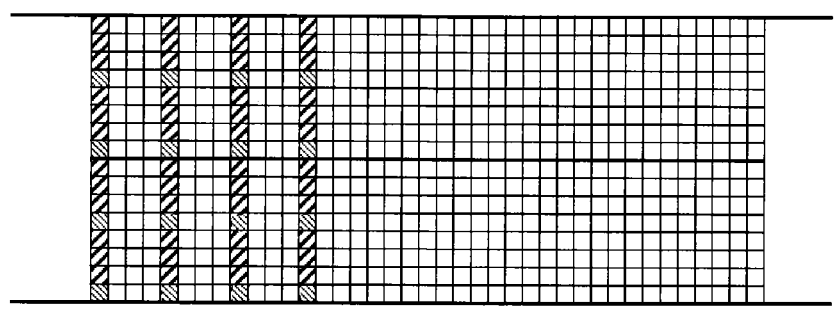
Figure 15C:
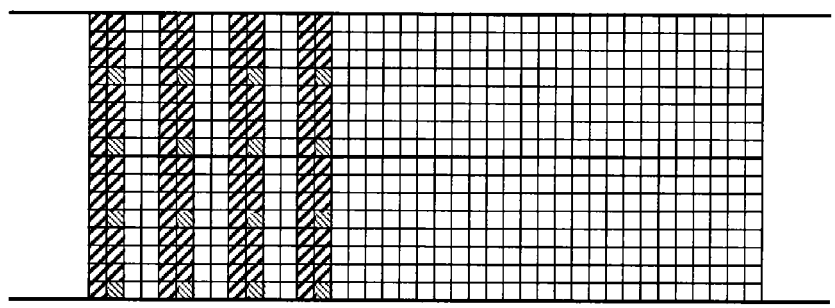

FIGS. 15A to 15C are conceptual diagrams explaining other examples of a writing operation in a stripe according to the first embodiment. FIGS. 15A to 15C show examples in which writing in a stripe is performed using 4×4 multiple beams in the x and y directions. The examples of FIG. 15A to FIG. 15C show the case where there is a distance between beams and a stripe region is divided in the y direction by a width somewhat greater than or equal to the irradiation region of the whole of multiple beams, for example. Exposure (writing) of one irradiation region by the whole of multiple beams is completed by sixteen shots (one shot is a total of a plurality of irradiation steps) performed while shifting the irradiation position by one mesh in the x direction or the y direction. FIG. 15A shows the mesh region irradiated by the first one-shot (one shot is a total of a plurality of irradiation steps). Next, as shown in FIG. 15B, the second one-shot, the third one-shot, and the fourth one-shot (one shot is a total of a plurality of irradiation steps) are performed while shifting the position by one mesh, one by one, in the y direction to the mesh region not having been irradiated yet. Next, as shown in FIG. 15C, the fifth one-shot (one shot is a total of a plurality of irradiation steps) is performed while shifting the position by one mesh in the x direction to the mesh region not having been irradiated yet. Next, the sixth one-shot, the seventh one-shot, and the eighth one-shot (one shot is a total of a plurality of irradiation steps) are performed while shifting the position by one mesh, one by one, in the y direction to the mesh region not having been irradiated yet.

Figure 16A:
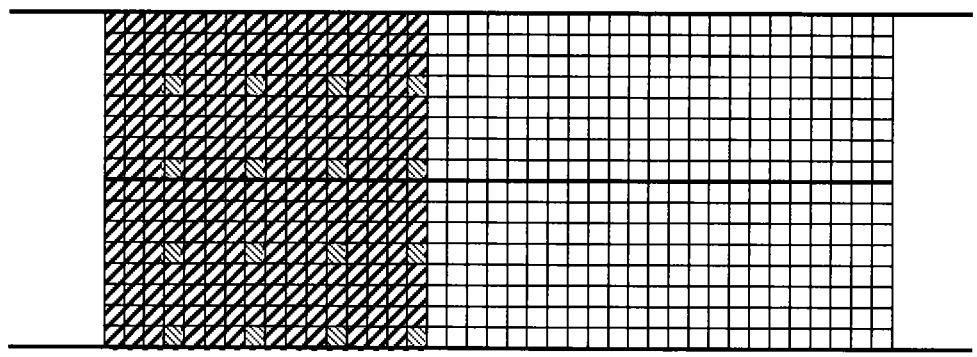
FIGS. 16A to 16C are conceptual diagrams explaining other examples of a writing operation in a stripe according to the first embodiment.
Figure 16B:
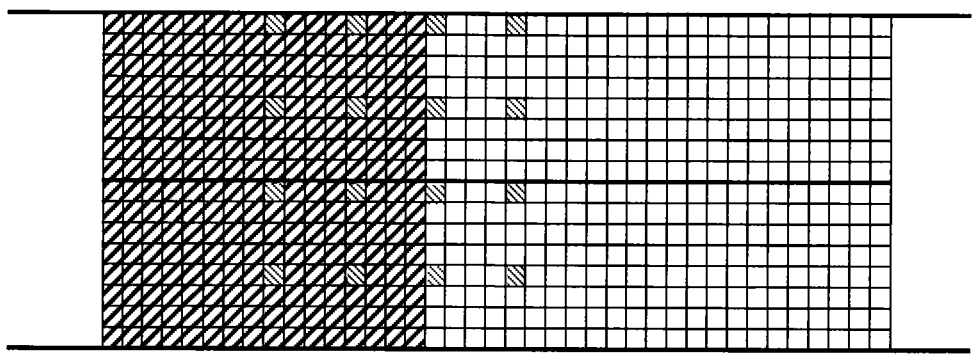
Figure 16C:
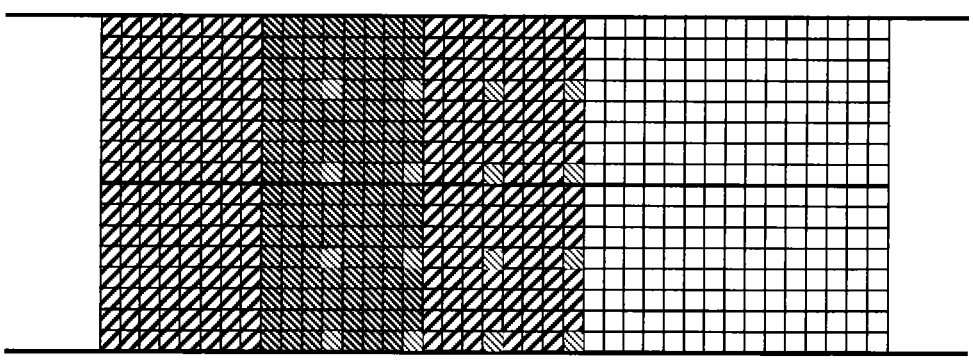

FIGS. 16A to 16C are conceptual diagrams explaining other examples of a writing operation in a stripe according to the first embodiment. FIGS. 16A to 16C are continued from FIG. 15C. As shown in FIG. 16A, the ninth one-shot to the sixteenth one-shot (one shot is a total of a plurality of irradiation steps) are repeatedly performed in order, similarly to the operations of FIGS. 14A to 14C. The examples of FIGS. 15A to 15C and FIGS. 16A to 16C show the case of performing multi-pass writing (multiplicity=2), for example. In such a case, the irradiation position is shifted in the x direction by about half the size of the irradiation region of the whole of multiple beams, and as shown in FIG. 16B, the first one-shot (one shot is a total of a plurality of irradiation steps) of the second layer of the multi-pass writing is performed. As described referring to FIGS. 15B and 15C, the second one-shot to the eighth one-shot (one shot is a total of a plurality of irradiation steps) of the second layer of the multi-pass writing are performed one by one, hereinafter. As shown in FIG. 16C the ninth one-shot to the sixteenth one-shot (one shot is a total of a plurality of irradiation steps) are to be repeatedly performed in order similarly to the operations of FIGS. 15B to 15C.

As described above, according to the first embodiment, it is possible to arrange further more pads in the blanking device that performs blanking control of multiple beams by using shift registers. Therefore, blanking control of more beams can be achieved.

Embodiments have been explained referring to concrete examples described above. However, the present invention is not limited to these specific examples. While the case of inputting a 10-bit control signal to the shift register 40 has been described above, the number of bits may be suitably set. For example, a 2-bit (or 3 to 9 bit) control signal may be used. In such a case, with respect to between the shift registers 40 connected in series and between the shift register 40 at the end of shift registers 40 connected in series and the serial parallel conversion unit 28, it should be connected by parallel wiring of a set number of bits. Of course, a 11 or more bit control signal may be used.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and multi charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A blanking device for multiple charged particle beams comprising:
    a substrate, in which a plurality of openings are formed, the plurality of openings being arranged in two dimensions and through which multiple beams pass;
    a plurality of shift registers, which are formed close to a corresponding opening in the plurality of openings on the substrate, configured to be arranged in two dimensions and to form a plurality of groups each including shift registers connected in series of the plurality of shift registers;
    a plurality of blankers, each of which includes a pair of electrodes arranged on the substrate to be at opposite sides of a corresponding opening in the plurality of openings, configured to respectively provide a blanking deflection to a corresponding beam of the multiple beams by generating a deflection electric field which is generated by respectively controlling at least one of the pair of electrodes through a shift register for a corresponding beam in the plurality of shift registers;
    a plurality of serial parallel conversion units configured to be arranged along four sides of a quadrangular region surrounding a whole of the plurality of shift registers and to be respectively connected by parallel wiring to at least one of the plurality of groups; and
    a plurality of pads configured to be arranged along the four sides of the quadrangular region, and to be respectively in combination with a corresponding serial parallel conversion unit of the plurality of serial parallel conversion units such that each of the plurality of pads is connected by single wiring to the corresponding serial parallel conversion unit.

2. The device according to claim 1, wherein a plurality of sets each composed of a pad of the plurality of pads and the corresponding serial parallel conversion unit are arranged at a same pitch at each of the four sides.

3. The device according to claim 2, wherein, at the each of the four sides, the plurality of sets each composed of the pad and the corresponding serial parallel conversion unit are arranged at 2n (n being a natural number) times a beam pitch of the multiple beams.

4. The device according to claim 1, wherein a same number of a plurality of sets each composed of a pad of the plurality of pads and the corresponding serial parallel conversion unit are arranged at each of the four sides.

5. The device according to claim 1, further comprising:
    a substrate including a first region having a thin film thickness and a second region having a thick film thickness,
    wherein the plurality of shift registers and the plurality of blankers are arranged in the first region having the thin film thickness of the substrate, and a plurality of sets each composed of a pad of the plurality of pads and the corresponding serial parallel conversion unit are arranged in the second region having the thick film thickness of the substrate.

6. The device according to claim 5, wherein a distance between the pad and the corresponding serial parallel conversion unit which configure each set of the plurality of sets is shorter than a distance between a side of the quadrangular region, where a set concerned of the plurality of sets is arranged, and an end of the substrate.

7. The device according to claim 1, further comprising:
    a plurality of control circuits configured to be arranged in two dimensions in the first region, and to respectively control a corresponding blanker in the plurality of blankers.

8. The device according to claim 7, wherein, in each of the plurality of the control circuits, a corresponding shift register in the plurality of shift registers is arranged.

9. The device according to claim 1, wherein the plurality of groups each are composed of the shift registers which are arranged in rows or columns of a two-dimensional arrangement and which are alternately arranged sandwiching one of shift registers belonging to different groups of the plurality of groups.

10. The device according to claim 1, wherein the plurality of groups, composed of the shift registers, include groups in rows and groups in columns in a two-dimensional arrangement and are formed such that the plurality of shift registers are not overlappingly used between the groups in rows and the groups in columns.

11. A multi charged particle beam writing apparatus comprising:
    a stage configured to mount a target object thereon and to be continuously movable;
    an emission unit configured to emit a charged particle beam;
    an aperture member, in which a plurality of first openings are formed, configured to form multiple beams by letting a region including a whole of the plurality of first openings be irradiated with the charged particle beam and letting portions of the charged particle beam respectively pass through a corresponding opening of the plurality of first openings;
    a substrate, in which a plurality of second openings are formed, the plurality of second openings being arranged in two dimensions and through which multiple beams pass;
    a plurality of shift registers, which are formed close to a corresponding opening in the plurality of openings on the substrate, configured to be arranged in two dimensions and to form a plurality of groups each including shift registers connected in series of the plurality of shift registers;
    a plurality of blankers, each of which includes a pair of electrodes arranged on the substrate to be at opposite sides of a corresponding opening in the plurality of second openings, configured to respectively provide a blanking deflection to a corresponding beam of multiple beams having passed through the plurality of openings of the aperture member, by generating a deflection electric field which is generated by respectively controlling at least one of the pair of electrodes through a shift register for a corresponding beam in the plurality of shift registers;

a plurality of serial parallel conversion units configured to be arranged along four sides of a quadrangular region surrounding a whole of the plurality of shift registers and to be respectively connected by parallel wiring to at least one of the plurality of groups; and a plurality of pads configured to be arranged along the four sides of the quadrangular region, and to be respectively in combination with a corresponding serial parallel conversion unit of the plurality of serial parallel conversion units such that each of the plurality of pads is connected by single wiring to the corresponding serial parallel conversion unit.

12. A blanking device for multiple charged particle beams comprising:

a substrate, in which a plurality of openings are formed, the plurality of openings being arranged in two dimensions and through which multiple beams pass;

a plurality of shift registers, which are formed close to a corresponding opening in the plurality of openings on the substrate, configured to be arranged in two dimensions and to form a plurality of groups each including shift registers connected in series of the plurality of shift registers;

a plurality of deflection means, each of which includes a pair of electrodes arranged on the substrate to be at opposite sides of a corresponding opening in the plurality of openings, for respectively providing a blanking deflection to a corresponding beam of the multiple beams by generating a deflection electric field which is generated by respectively controlling at least one of the pair of electrodes through a shift register for a corresponding beam in the plurality of shift registers;

a plurality of serial parallel conversion means for being arranged along four sides of a quadrangular region surrounding a whole of the plurality of shift registers and being respectively connected by parallel wiring to at least one of the plurality of groups; and a plurality of pads configured to be arranged along the four sides of the quadrangular region, and to be respectively in combination with a corresponding serial parallel conversion unit of the plurality of serial parallel conversion units such that each of the plurality of pads is connected by single wiring to the corresponding serial parallel conversion unit.

\* \* \* \* \*